United States Patent [19]
Furutani et al.

[11] Patent Number: 5,640,363
[45] Date of Patent: Jun. 17, 1997

[54] SEMICONDUCTOR MEMORY DEVICE

[75] Inventors: Kiyohiro Furutani; Tadaaki Yamauchi; Makiko Aoki, all of Hyogo, Japan

[73] Assignee: Mitsubishi Denki Kabushiki Kaisha, Tokyo, Japan

[21] Appl. No.: 542,958

[22] Filed: Oct. 13, 1995

Related U.S. Application Data

[62] Division of Ser. No. 306,098, Sep. 14, 1994, Pat. No. 5,487,043.

[30] Foreign Application Priority Data

Sep. 17, 1993 [JP] Japan ................................ 5-231701

[51] Int. Cl.$^6$ ........................................................ G11C 7/00
[52] U.S. Cl. .................. 365/233.5; 365/190; 365/194; 365/202; 365/203; 365/207; 365/230.03
[58] Field of Search ............................... 365/233.5, 203, 365/202, 190, 207, 194, 230.03

[56] References Cited

U.S. PATENT DOCUMENTS 5,343,432   8/1994   Matsuo et al. ......................... 365/203
5,392,249   2/1995   Kan ........................................ 365/203

OTHER PUBLICATIONS

IEEE Journal of Solid-State Circuits, vol. SC-19, No. 6, Dec. 1984, S. 1008 – 1013.

*Primary Examiner*—Son T. Dinh
*Attorney, Agent, or Firm*—Lowe, Price, LeBlanc & Becker

[57] ABSTRACT

The present invention semiconductor memory device includes common signal lines from which memory cell data is read and an amplifier for detecting a potential difference between these common signal lines, wherein equalization of the common signal lines is started when a potential difference required for an operation of the amplifier is generated on the common signal lines.

Also, a semiconductor memory device having a plurality of memory cell arrays includes first common signal lines for reading memory cell data and second common signal lines having the first common signal lines connected thereto. The first common signal lines are operated in an activated state only after a writing operation, whereby access time of the semiconductor device can be shortened.

5 Claims, 13 Drawing Sheets

FIG. 6(a) Add. 
FIG. 6(b) φ1 
FIG. 6(c) φ2 
FIG. 6(d) φ3 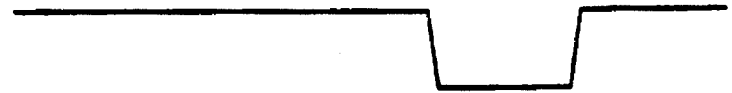
FIG. 6(e) φ3(far) 

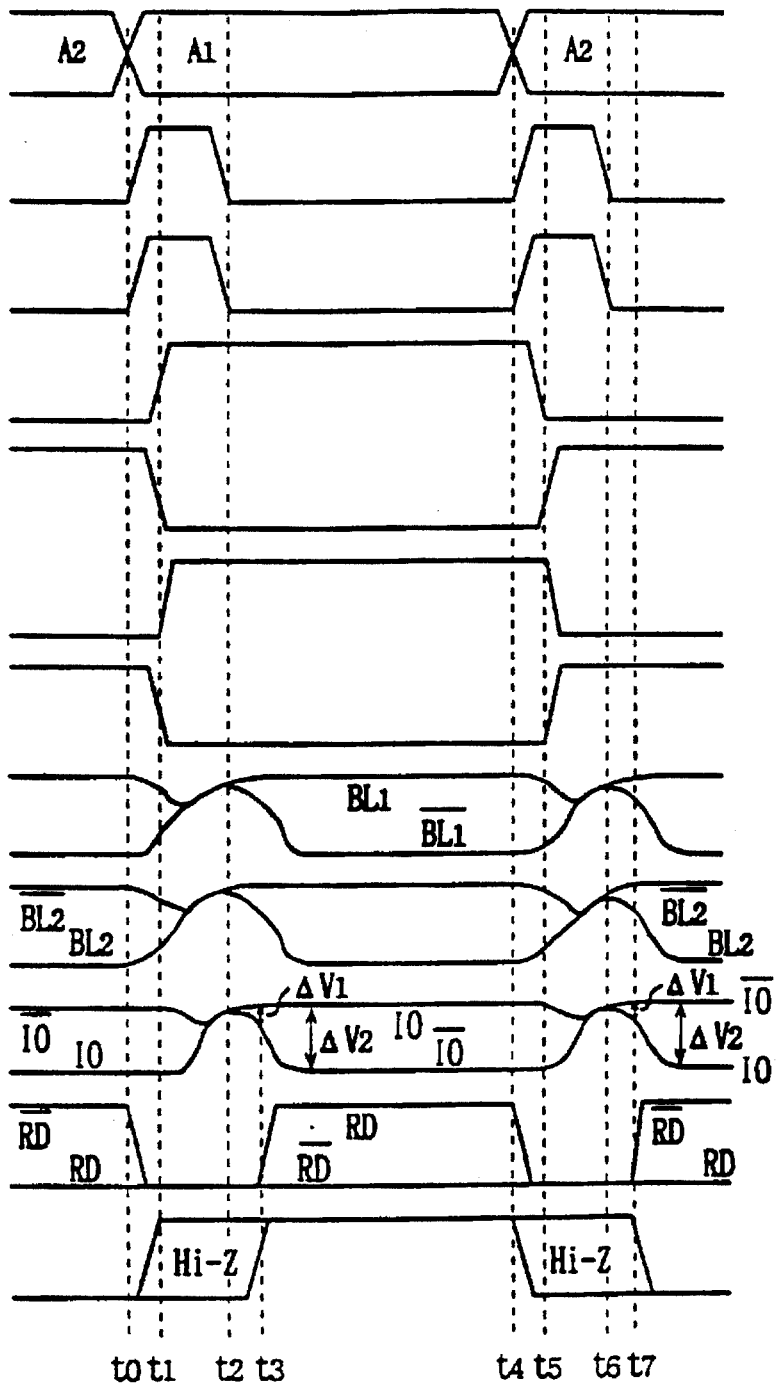

SEMICONDUCTOR MEMORY DEVICE

This application is a division of application Ser. No. 08/306,098 filed Sep. 14, 1994 now U.S. Pat. No. 5,487,043.

BACKGROUND OF THE INVENTION

1. Field of the Invention

The present invention generally relates to semiconductor memory devices, and more particularly, it is concerned with an improvement of a circuit which carries out equalization of a pair of signal lines by which data is read from a memory cell.

2. Description of the Background Art

FIG. 12 is a diagram showing a read circuit of a conventional semiconductor memory device described, for example, in *IEEE Journal of Solid State Circuit*, Vol. SC-22, No. 5, pp 733–740. With reference to FIG. 12, an address signal ADD is externally applied to an address pin 1. An address buffer 2 receives address signal ADD applied to address pin 1 and outputs an internal address signal intADD to be applied internally.

An address change detecting circuit 3 receives internal address signal intADD applied from address buffer 2, and outputs an address change signal $\phi_1$ which attains a H (High) level for a certain period as the internal address signal intADD changes. An inverter 4 receives address change signal $\phi_1$ applied from address change detecting circuit 3. An inverter 5 has its input node connected to an output node of inverter 4 and outputs an equalize signal $\phi_E$.

A row decoder 6 receives internal address signal intADD applied from address buffer 2, and raises one of potentials $WL_1$, $WL_2$, . . . respectively applied on a plurality of word lines 7a, 7b, . . . from a L (Low) level to the H level in response to the internal address signal intADD. A memory cell array 8 includes a plurality of memory cells 9 (general designation for 9aa, 9ab, . . . ), a plurality of word lines 7 (general designation for 7a, 7b, . . . ), and a plurality of bit line pairs 10 (general designation for 10a, 10b, . . . ) and 11 (general designation for 11a, 11b, . . . ).

In this memory cell array 8, each memory cell 9 is arranged at a crossing of word line 7 and bit line pair 10, 11. Therefore, a plurality of memory cells 9 are arranged in a matrix manner. Also, each of the plurality of memory cells 9 is connected to word line 7 and bit line pair 10, 11.

Each of the plurality of memory cells 9 includes two driver transistors 13 (general designation for 13aa, 13ab, . . . ) and 14 (general designation for 14aa, 14ab, . . . ) formed by n channel MOS transistors, resistors of a high-load type 16 (general designation for 16aa, 16ab, . . . ) and 17 (general designation for 17aa, 17ab, . . . ), and two access transistors 18 (general designation for 18aa, 18ab, . . . ) and 19 (general designation for 19aa, 19ab, . . . ) formed by n channel MOS transistors.

Now, structure of each of the plurality of memory cells 9 will be described. The ground potential is applied to a ground potential node 12. A power supply potential $V_{CC}$ is applied to a power supply potential node 15. Driver transistors 13 and 14 have their source electrodes connected to ground potential node 12, and have one gate electrode connected to the other drain electrode and the other gate electrode connected to one drain electrode.

Resistor 16 is connected between power supply potential node 15 and the drain electrode of driver transistor 13, and resistor 17 is connected between power supply potential node 15 and the drain electrode of driver transistor 14.

Access transistor 18 is connected between bit line 10 and the drain electrode of driver transistor 13 and has its gate electrode connected to word line 7. Access transistor 19 is connected between bit line 11 and the drain electrode of driver transistor 14, and has its gate electrode connected to word line 7.

A column decoder 20 receives internal address signal intADD applied from address buffer 2, and raises one of potentials CSL1, CSL2, . . . respectively applied on a plurality of column selection lines 21 (general designation for 21a, 21b, . . . ) from the L level to the H level in response to the internal address signal intADD.

An I/O gate circuit 22 includes a plurality pairs of two n channel MOS transistors 25 (general designation for 25a, 25b, . . . ) and 26 (general designation for 26a, 26b). In this I/O gate circuit 22, transistors 25 and 26 are respectively connected between bit line pairs 10 and 11 and an I/O line pair 23 and 24. These transistors 25 and 26 have respective gates connected to column selection lines 21. I/O gate circuit 22 transfers a pair of potentials of potentials $BL_1$ and $\overline{BL_1}$, $BL_2$ and $\overline{BL_2}$, . . . applied on the plurality of bit line pairs 10, 11 respectively to I/O line pair 23 and 24.

A bit line equalizing circuit 27 receives equalize signal $\phi_E$ from inverter 5 and equalizes the potential on bit line pairs 10 and 11 to a potential $V_{CC}$-$V_{th}$ which is lower than power supply potential $V_{CC}$ by $V_{th}$ when the equalize signal $\phi_E$ almost attains the H level of power supply potential $V_{CC}$.

This bit line equalizing circuit 27 includes a transistor for precharging 28 (general designation for 28a, 28b, . . . ) which is connected between power supply potential node 15 and bit line 10 and receives equalize signal $\phi_E$ at a gate electrode, a transistor for precharging 29 (general designation for 29a, 29b, . . . ) which is connected between power supply potential node 15 and bit line 11 and receives equalize signal $\phi_E$ at a gate electrode, and a transistor for equalization 30 which is connected between bit lines 10 and 11 and receives equalize signal $\phi_E$ at a gate electrode. Transistors for precharging 28 and 29 have a threshold voltage respectively.

A differential amplifier 31 receives potentials IO, $\overline{IO}$ applied on I/O line pair 23, 24, and amplifies a potential difference therebetween to output read data RD, $\overline{RD}$. An output buffer circuit 32 receives read data RD, $\overline{RD}$ applied from differential amplifier 31 and outputs output data Dout to an output pin 33.

FIG. 13 is a timing chart showing operations of the semiconductor memory device shown in FIG. 12. Now, operations of the conventional semiconductor device shown in FIG. 12 will be described based on the timing chart shown in FIG. 13. It is assumed that data at the H level and the L level are respectively stored in memory cells 9aa and 9bb of memory cells 9 shown in FIG. 12. Also, it is assumed that the data at the L level is initially read from memory cell 9bb.

In the following description, operations of subsequently reading data at the H level from memory cell 9aa, and then reading data at the L level again from memory cell 9bb will be described.

First, until time $t_0$ when the externally applied address signal ADD changes from $A_2$ to $A_1$ as shown in FIG. 13(a), equalize signal $\phi_E$ output from address change detecting circuit 3 through inverters 4 and 5 is at the L level as shown in FIG. 13(c).

Therefore, precharging transistors 28 and 29 and equalizing transistor 30 receiving equalize signal $\phi_E$ at gates are non-conductive, so that equalization of bit lines is stopped.

At the same time, a potential $WL_2$ of word line 7b is at the H level as shown in FIG. 13(e). Therefore, access transistors

3

18*bb*, 19*bb* in memory cell 9*bb* connected to word line 7*b* are respectively rendered conductive. Accordingly, the L level potential and the H level potential respectively stored in drain electrodes of driver transistors 13*bb* and 14*bb* are read to bit lines 10*b* and 11*b*, respectively. Thus, potentials BL$_2$ and $\overline{BL_2}$ on bit lines 10*b* and 11*b* are at the L level and the H level, respectively, as shown in FIG. 13(*i*).

At this time, column decoder 20 raises potential CSL$_2$ on column selection line 21*b* corresponding to address signal A$_2$ to the H level as shown in FIG. 13(*g*). Therefore, in I/O gate circuit 22, n channel MOS transistors 25*b* and 26*b* receiving potential CSL$_2$ at the gate electrodes are respectively rendered conductive.

Therefore, bit lines 10*b* and 11*b* are respectively connected to I/O lines 23 and 24 through n channel MOS transistors 25*b* and 26*b*. Thus, potentials IO and $\overline{IO}$ on I/O lines 23 and 24 are at the L level and the H level, respectively as shown in FIG. 13(*j*).

Differential amplifier 31 receiving potentials IO and $\overline{IO}$ on I/O lines 23 and 24 outputs read data RD at the L level and read data $\overline{RD}$ at the H level, as shown in FIG. 13(*k*). Also, output buffer circuit 32 receiving these outputs supplies output data Dout at the L level to output pin 33, as shown in FIG. 13(*m*).

Then, as shown in FIG. 13(*a*) when externally applied address signal ADD changes from A$_2$ to A$_1$ at time t$_0$, correspondingly internal address intADD output from address buffer 2 changes. Accordingly, address change detecting circuit 3 receiving the internal address intADD outputs address change signal $\phi_1$ which attains the H level for a predetermined period until time t$_2$, as shown in FIG. 13(*b*).

In response to address change signal $\phi_1$, equalize signal $\phi_E$ output through inverters 4 and 5 attain the H level as shown in FIG. 13(*c*). Therefore, precharging transistors 28 and 29 and equalizing transistor 30 receiving equalize signal $\phi_E$ at the gate electrodes are rendered conductive, respectively. Thus, as shown in FIG. 13(*h*) and (*i*), potentials BL$_1$ and $\overline{BL_1}$ on bit line 10 and potentials BL$_2$ and $\overline{BL_2}$ on bit line 11 are equalized to potential V$_{CC}$-V$_{th}$ which is lower than power supply potential V$_{CC}$ by threshold voltage V$_{th}$ of respective precharging transistors 28 and 29.

On the other hand, row decoder 6 responds to address signal ADD changing from A$_2$ to A$_1$ at time t$_0$ to cause potential WL$_2$ on word line 7*b* to fall to the L level at time t$_1$ and at the same time raises potential WL$_1$ on word line 7*a* to the H level as shown in FIG. 13(*d*). In response to this, access transistors 18*aa* and 19*aa* in memory cell 9*aa* are rendered conductive.

At this time, potentials BL$_1$ and $\overline{BL_1}$ on bit lines 10*a* and 11*a*, respectively, become equal by equalization as shown in FIG. 13(*h*); however, the potentials of drain electrodes of respective driver transistors 13*aa* and 14*aa* are held at the H level and the L level. The reason of this is a relatively large ON resistance of access transistors 18*aa* and 19*aa*.

In the meanwhile, column decoder 20 responds to address signal ADD changing from A$_2$ to A$_1$ at time t$_0$ to cause potential CSL$_2$ on column selection line 21*b* to fall to the L level at a time approximately the same time as time t$_1$, as shown in FIG. 13(*g*). At the same time, column decoder 20 raises potential CSL$_1$ on column selection line 21*a* to the H level as shown in FIG. 13(*f*).

In response to this, n channel MOS transistors 25*a* and 26*a* in I/O gating circuit 22 are rendered conductive, causing bit lines 10*a* and 11*a* to be connected respectively to I/O lines 23 and 24. Therefore, potentials IO and $\overline{IO}$ on I/O lines 23 and 24 are equalized as shown in FIG. 13(*j*).

4

Further, differential amplifier 31 is deactivated in response to equalize signal $\phi_E$ attaining the H level, whereby differential amplifier 31 outputs read data RD and $\overline{RD}$, both of which attaining the L level, as shown in FIG. 13(*k*). Output buffer 32 outputs data D$_{out}$ of high impedance (Hi-Z), as shown in FIG. 13(*m*), in response to both of read data RD and $\overline{RD}$ attaining the L level.

As shown in FIG. 13(*b*), address change signal $\phi_1$ output from the address change detecting circuit is fallen to the L level at time t$_2$. In response to this address change signal $\phi_1$, equalize signal $\phi_E$ output through inverters 4 and 5 is fallen to the L level as shown in FIG. 13(*c*).

In bit line equalizing circuit 27, precharging transistors 28, 29 and equalizing transistor 30 which receive the equalize signal $\phi_E$ are respectively rendered non-conductive. This stops equalization of bit lines 10 and 11, causing potentials at the H level and at the L level held in respective drain electrodes of driver transistors 13*aa* and 14*aa* in memory cell 9*aa* to be read respectively. Therefore, potentials BL$_1$ and $\overline{BL_1}$ on bit lines 10*a* and 11*a* attain the H level and the L level, respectively, as shown in FIG. 13(*h*).

In response to this, a potential difference between potentials IO and $\overline{IO}$ on I/O lines 23 and 24 connected to bit lines 10*a* and 11*a* becomes greater, as shown in FIG. 13(*j*). The potential difference attains $\Delta V_1$ at time t$_3$ and increases to $\Delta V_2$. As a result, potentials IO and $\overline{IO}$ attain the H level and the L level, respectively.

When the potential difference between potentials IO and $\overline{IO}$ attains $\Delta V_1$, differential amplifier 31 receiving potentials IO and $\overline{IO}$ on I/O lines 23 and 24 outputs read data RD which rises to the H level and complementary read data $\overline{RD}$ at the L level, as shown in FIG. 13(*k*). Receiving these outputs, output buffer circuit 32 supplies externally output data D$_{out}$ which attains the H level to output pin 33, as shown in FIG. 13(*m*).

Then, as shown in FIG. 13(*a*), when externally applied address signal ADD changes from A$_1$ to A$_2$ at time t$_4$, in response to this, internal address intADD output from address buffer 2 changes.

Address change detecting circuit 3 receiving the internal address intADD outputs address change signal $\phi_1$ which attains the H level for a predetermined period until time t$_6$, as shown in FIG. 13(*b*). In response to the address change signal $\phi_1$, equalize signal $\phi_E$ output through inverters 4 and 5 attains the H level as shown in FIG. 13(*c*).

This causes precharging transistors 28 and 29 and equalizing transistors 30 which receive equalize signal $\phi_E$ at the gate electrodes to be rendered conductive. Therefore, as shown in FIG. 13(*h*) and (*i*), potentials BL$_1$ and $\overline{BL_1}$ and BL$_2$ and $\overline{BL_2}$ on bit lines 10 and 11 are equalized to potential V$_{CC}$-V$_{th}$ which is lower than power supply potential V$_{CC}$ by threshold voltage V$_{th}$ of respective precharging transistors 28 and 29.

On the other hand, in response to address signal ADD changing from A$_1$ to A$_2$ at time t$_4$, row decoder 6 causes potential WL$_1$ on word line 7*a* to fall to the L level at time t$_5$ as shown in FIG. 13(*d*), and at the same time raises potential WL$_2$ on word line 7*b* to the H level as shown in FIG. 13(*e*). In response to this, access transistors 18*bb* and 19*bb* in memory cell 9*bb* are rendered conductive, respectively.

Also, in response to address signal ADD changing from A$_1$ to A$_2$ at time t$_4$, column decoder 20 causes potential CSL$_1$ on column selection line 21*a* to fall to the L level at approximately the same time as time t$_5$ as shown in FIG. 13(*f*), and at the same time, raises potential CSL$_2$ on column selection line 21b to the H level as shown in FIG. 13(g). In response to these potentials $CSL_1$ and $CSL_2$, n channel MOS transistors 25b and 26b in I/O gate circuit 22 are rendered conductive, respectively.

This connects bit lines 10b and 11b with I/O lines 23 and 24, respectively. Therefore, potentials IO and $\overline{IO}$ on I/O lines 23 and 24 are equalized as shown in FIG. 13(j).

Further, differential amplifier 31 is deactivated in response to equalize signal $\phi_E$ attaining the H level. As shown in FIG. 13(k), differential amplifier 31 outputs read data RD and $\overline{RD}$, both of which attaining the L level. In response to both read data RD and $\overline{RD}$ attaining the L level, output buffer circuit 32 outputs data $D_{out}$ of high impedance (Hi-Z), as shown in FIG. 13(m).

Then, as shown in FIG. 13(b), address change signal $\phi_1$ output from address change detecting circuit 3 is fallen to the L level at time $t_6$. In response to address change signal $\phi_1$, equalize signal $\phi_E$ output through inverters 4 and 5 is fallen to the L level, as shown in FIG. 13(c).

In bit line equalizing circuit 27, precharging transistors 28, 29 and equalizing transistor 30 which receive equalize signal $\phi_E$ are rendered non-conductive, respectively. This stops equalization of bit lines 10 and 11.

Accordingly, potentials at the L level and the H level held in respective drain electrodes of driver transistors 13bb and 14bb in memory cell 9bb are read to bit lines 10b and 11b. Therefore, potentials $BL_2$ and $\overline{BL_2}$ on bit lines 10b and 11b attain the L level and the H level, respectively, as shown in FIG. 13(i).

In response to this, a potential difference between potentials IO and $\overline{IO}$ on I/O lines 23 and 24 connected to these bit lines 10b and 11b becomes greater. The potential difference attains $\Delta V_1$ at time $t_7$, and increases to $\Delta V_2$. This causes potentials IO and $\overline{IO}$ to attain the L level and the H level, respectively.

When the potential difference between potentials IO and $\overline{IO}$ attains $\Delta V_1$, differential amplifier 31 receiving potentials IO and $\overline{IO}$ on these I/O lines 23 and 24 outputs read data $\overline{RD}$ which rises to the H level and complementary read data RD which is at the L level, as shown in FIG. 13(k). In response to this, output buffer circuit 32 outputs data $D_{out}$ which attains the L level to output pin 33, as shown in FIG. 13(m).

Now, a problem associated with the above-described conventional semiconductor memory device will be described. In the conventional semiconductor memory device, differential amplifier 38 has already detected at the time when the potential difference between potentials IO and $\overline{IO}$ on I/O lines 23 and 24 increases to reach $\Delta V_1$ (time $t_3$ and $t_7$) whether the data read to I/O lines 23 and 24 being at the H level or the L level. Then, differential amplifier 31 outputs read data RD and $\overline{RD}$ having the H level and the L level or having the L level and the H level depending on the detection.

Upon reception of read data RD and $\overline{RD}$, output buffer 32 outputs data $D_{out}$ having the H level or the L level. It should be noted that equalization of bit lines is carried out for a predetermined time period ($t_0$-$t_2$ and $t_4$-$t_6$) after the change of externally applied address signal ADD. Therefore, even though differential amplifier 31 has already detected whether the data being at the H level or the L level, the potential difference between potentials IO and $\overline{IO}$ on I/O lines 23 and 24 continues increasing to reach the maximum value of $\Delta V_2$.

Thus, a considerable time is required to render potentials IO and $\overline{IO}$ equal by equalization of I/O lines 23 and 24 after next time the address signal is changed into another address, thus requiring a long time before the subsequent data is read.

SUMMARY OF THE INVENTION

An object of the present invention is to shorten access time of a semiconductor memory device.

Another object of the present invention is to accelerate a reading operation of a semiconductor memory device.

Still another object of the present invention is to prevent increase of access time due to a signal delay when input/output lines are formed hierarchically.

A semiconductor memory device according to the present invention includes first and second signal lines, an amplifying circuit, an equalize signal generating circuit, and a signal line equalizing circuit.

Potentials corresponding to data from a memory cell are respectively output to the first and second signal lines.

The amplifying circuit receives potentials on the first and second signal lines, and outputs read data which attains a first level when the potential on the first signal line is higher than that on the second signal line by at least a first predetermined voltage, and attains a second level when the potential on the first signal line is lower than that of the second signal line by at least a second predetermined voltage.

The equalize signal generating circuit receives an address signal, and outputs an equalize signal which changes from a third level to a fourth level in response to a change of the address signal, and attains the third level when an absolute value of a potential difference between the first and second signal lines attains either one of the first and second predetermined voltages.

The signal line equalizing circuit is connected to the first and second signal lines, and receives the equalize signal for equalizing potentials on the first and second signal lines when the equalize signal is at the third level, and stopping equalization of potentials on the first and second signal lines when the equalize signal is at the fourth level.

Therefore, as the address signal changes, the equalize signal output from the equalize signal generating circuit changes from the third level to the fourth level. In response to this, the signal line equalizing circuit stops equalization of the first and second signal lines. Accordingly, potentials corresponding to the data from the memory cell responding to the address signal are output to the first and second signal lines.

The amplifying circuit receiving the potentials on these signal lines outputs read data having a level corresponding to the potential difference between the first and second signal lines. The read data attains the first level when the potential on the first signal line is higher than that on the second signal line by at least the first predetermined voltage, and attains the second level when the potential on the first signal line is lower than that on the second signal line by at least the second predetermined voltage.

The equalize signal output from the equalize signal generating circuit attains the third level when the absolute value of the potential difference between the first and second signal lines attains either one of the first and second predetermined voltages. In other words, the equalize signal attains the third level when the amplifying circuit attains a voltage such as to allow output of the read data having the first or the second level.

Accordingly, the signal line equalizing circuit receiving the equalize signal starts equalizing the first and second signal lines. This prevents increase of the potential difference between the first and second signal lines from reaching the maximum value, and at the same time, allows completion of equalization for the subsequent access. Therefore, time required for reading the data after input of the subsequent address can be shortened.

Thus, since equalization of signal lines is set to start when a read potential having a certain amplitude is read onto the first and second signal lines including bit lines or input/output lines, the subsequent reading operation can be accelerated, thus shortening access time.

A semiconductor memory device according to another aspect of the present invention includes first and second signal lines, an amplifying circuit, an equalize signal generating circuit, a signal line equalizing circuit, and a row decoder, wherein the equalize signal generating circuit includes an address change detecting circuit, and first and second signal generating circuits.

Potentials corresponding to data from a memory cell are output to the first and second signal lines.

The amplifying circuit receives potentials on the first and second signal lines, and outputs read data which attains a first level when a potential on the first signal line is higher than that on the second signal line by at least a first predetermined voltage, and attains a second level when a potential on the first signal line is lower than that on the second signal line by at least a second predetermined voltage.

The equalize signal generating circuit generates an equalize signal for equalizing potentials on the first and second signal lines, and a first signal for prohibiting output of a potential from the memory cell during equalization.

The address change detecting circuit included in the equalize signal generating circuit receives an address signal and outputs an address change signal having two levels which changes from a third level to a fourth level for a predetermined period in response to a change of the address signal.

The first signal generating circuit includes a delay circuit, receives the address change signal and a delay signal provided by passing an internally generated first signal having two levels of fifth and sixth levels through the delay circuit, and generates the first signal which changes from the fifth to the sixth level in response to the address change signal changing from the third level to the fourth level, and which changes from the sixth level to the fifth level in response to a change of the delay signal in accordance with the first signal changing from the fifth level to the sixth level.

The second signal generating circuit outputs the equalize signal which changes from a seventh level to an eighth level when the address change signal attains the third level and the first signal attains the sixth level, and changes from the eight level to the seventh level when the first signal attains the fifth level.

The signal line equalizing circuit is connected to the first and second signal lines and receives the equalize signal for equalizing the potentials on the first and second signal lines when the equalize signal is at the seventh level and stopping equalization of the potentials on the first and second signal lines when the equalize signal is at the eighth level.

The row decoder has a plurality of word lines connected thereto, receives the first signal, and renders all the word lines at the ground potential when the first signal is at the sixth level.

Therefore, in the equalize signal generating circuit, the address change signal output from the address change detecting circuit changes from the third level to the fourth level in response to the change of the address signal. In response to this, the first signal output from the first signal generating circuit changes from the fifth level to the sixth level.

When a predetermined period is passed, the address change signal changes from the fourth level to the third level. This causes the equalize signal output from the second signal generating circuit receiving the address change signal and the first signal having the sixth level to change from the seventh level to the eighth level.

Then, the signal line equalizing circuit receiving the equalize signal stops equalization of the first and second signal lines, whereby the potentials corresponding to the data from the memory cell responding to the address signal are output to the first and second signal lines.

The amplifying circuit receiving the potentials on these signal lines outputs read data having the level corresponding to the potentials on the first and second signal lines. The read data attains the first level when the potential on the first signal line is higher than that on the second signal line by at least the first predetermined voltage, and attains the second level when the potential on the first signal line is lower than that on the second signal line by at least the second predetermined voltage.

The delay circuit in the equalize signal generating circuit outputs the delay signal which is delayed by a predetermined delay time before being changed in response to the first signal output from the first signal generating circuit changing from the fifth level to the sixth level. In response to the change of the delay signal, the first signal output from the first signal generating circuit changes from the sixth level to the fifth level.

In response to this, the equalize signal output from the second signal generating circuit changes from the fourth level to the third level. In response to the equalize signal, the signal line equalizing circuit starts equalizing the first and second signal lines.

The equalization is started when an absolute value of the potential difference between the first and second signal lines attains either one of first and second predetermined voltages.

Therefore, by adjusting the delay time of the delay circuit so that equalization can be started when the amplifying circuit attains such a voltage as can output the read data having either the first level or the second level, increase of the potential difference between the first and second signal lines can be easily prevented from reaching to the maximum value, and at the same time equalization for the subsequent operation can be completed.

Therefore, time required to read data after input of the subsequent address can be shortened.

Thus, since equalization is set to start when a read potential having a predetermined amplitude is read to the signal lines including bit lines or input/output lines, the subsequent reading operation can be accelerated, thus shortening access time.

Also, the row decoder renders all potentials on the word lines to attain the ground potential when the first signal is at the sixth level. Therefore, if equalization of the first and second signal lines is started in response to the equalize signal changing from the eighth level to the seventh level, then all the word lines are deactivated at the ground potential. Therefore, such a state as to attempt to cause the potential difference corresponding to data from the memory cell is not generated on the first and second signal lines.

By thus prohibiting output of the potential from the memory cell during equalization, a current flow between the first and second signal lines through the signal line equalizing circuit can be reduced, whereby power consumption of the device can be reduced.

A semiconductor memory device according to still another aspect of the present invention includes first and second signal lines, a plurality of signal line pairs, an amplifying circuit, an equalize signal generating circuit, and a plurality of first and second signal line equalizing circuits.

The first and second signal lines respectively extend in predetermined directions, are juxtaposed, and receives potentials corresponding to data from a memory cell.

The plurality of signal line pairs are provided along the first and second signal lines, each pair extends perpendicularly to the first and second signal lines and is consisted of a third signal line corresponding to the first signal line and a fourth signal line corresponding to the second signal line, and these third and fourth signal lines are connected to the corresponding first and second signal lines through a connecting circuit for carrying out connection and disconnection in response to a connection signal.

The amplifying circuit receives potentials on the first and second signal lines, and outputs read data which attains a first level when the potential on the first signal line is higher than that on the second signal line by at least a first predetermined voltage and attains a second level when the potential on the first signal line is lower than that on the second signal line by at least a second predetermined voltage.

The equalize signal generating circuit receives an address signal, and outputs a first equalize signal having two levels which changes from a third level to a fourth level when a predetermined period is passed after the address signal is changed, and a second equalize signal which changes from a fifth level to a sixth level after the first equalize signal changing from the third level to the fourth level and attains the sixth level when an absolute value of a potential difference between the first and second signal lines attains either one of the first and second predetermined voltages.

The plurality of first signal line equalizing circuits are provided corresponding respectively to the plurality of signal line pairs, and each circuit receives the first equalize signal for equalizing potentials on the corresponding third and fourth signal lines when the first equalize signal is at the third level and stopping equalization when the first equalize signal is at the fourth level.

The second signal line equalizing circuit is connected to the first and second signal lines, and receives the second equalize signal for equalizing the potentials on the first and second signal lines when the second equalize signal is at the fifth level and stopping equalization when the second equalize signal is at the sixth level.

Therefore, the first equalize signal output from the equalize signal generating circuit changes from the third level to the fourth level when the predetermined period is passed after the address signal is changed. In response to this, each of the first signal line equalizing circuits stops equalization of the third and fourth signal lines.

Accordingly, the second equalize signal output from the equalize signal generating circuit changes from the fifth level to the sixth level. In response to this, the second signal line equalizing circuit stops equalizing the first and second signal lines.

By thus stopping equalization of the third and fourth signal lines at a time earlier than stopping equalization of the first and second signal lines, the following problem can be solved.

For instance, when the signal line pair consisting of the third and fourth signal lines disposed far from the equalize signal generating circuit is connected to the first and second signal lines, the following state might be generated. More particularly, even though equalization of the first and second signal lines has been stopped by the second equalize signal changing from the third level to the fourth level, equalization of the third and fourth signal lines is not stopped.

The above state is generated because of transfer delay of the first equalize signal to the first signal line equalizing circuit provided corresponding to the signal line pair consisting of the third and fourth signal lines disposed far from the equalize signal generating circuit.

In this case, since stopping of equalization is delayed, equalization of the signal line pair continues in the subsequent reading operation, whereby the potential difference corresponding to the data from the memory cell is not transferred to the first and second signal lines from the signal line pair through the connecting circuit, so that the read data might not be output from the amplifying circuit.

In the semiconductor memory device according to this aspect, as described above, equalization of the third and fourth signal lines is stopped earlier than equalization of the first and second signal lines, thus preventing a disadvantage due to the signal delay. Thus, time required to read data after input of the next address can be shortened.

Further, in operation, the potentials corresponding to data from the memory cell are output to the first and second signal lines. The amplifying circuit receiving the potentials on these signal lines outputs read data having the level corresponding to the potential difference between the first and second signal lines. The read data attains the first level when the potential on the first signal line is higher than that on the second signal line by at least the first predetermined voltage, and attains the second level when the potential on the first signal line is lower than that on the second signal line by at least the second predetermined voltage.

The second equalize signal output from the equalize signal generating circuit attains the third level when the absolute value of the potential difference between the first and second signal lines attains either the first predetermined voltage or the second predetermined voltage. More particularly, the second equalize signal attains the fifth level when the amplifying circuit attains such a voltage as to allow output of read data having either the first level or the second level.

Accordingly, the second signal line equalizing circuit receiving the second equalize signal starts equalization of the first and second signal lines. This can prevent the potential difference between the first and second signal lines from reaching the maximum value, and at the same time complete equalization for the subsequent operation, so that time required to read data after input of the subsequent address can be shortened.

Thus, access time can be shortened, and besides, increase in access time due to a signal delay when input/output lines are formed hierarchically can be prevented.

A semiconductor memory device according to still another aspect of the present invention includes first and second signal lines, a plurality of signal line pairs, an amplifying circuit, an equalize signal generating circuit, a first signal line equalizing circuit, and a second signal line equalizing circuit.

The first and second signal lines respectively extend in predetermined directions, are juxtaposed, and receive potentials corresponding to data from a memory cell.

The plurality of signal line pairs are provided along the first and second signal lines, each pair corresponding perpendicularly to the first and second signal lines and being consisted of a third signal line corresponding to the first signal line and a fourth signal line corresponding to the second signal line, and these third and fourth signal lines are connected to corresponding first and second signal lines through a connecting circuit for conducting connection and disconnection in response to a connection signal.

The amplifying circuit receives potentials on the first and second signal lines, and outputs read data which attains a first level when a potential on the first signal line is higher than that on the second signal line by at least a first predetermined voltage and attains a second level when the potential on the first signal line is lower than that on the second signal line by at least a second predetermined voltage.

The equalize signal generating circuit receives a write signal which attains a third level at the time of data reading and changes from the third level to a fourth level at the time of data writing, and also receives an address signal, and outputs a first equalize signal having two levels which changes from a fifth level to a sixth level to hold the sixth level for a predetermined period in response to the write signal changing from the fourth level to the third level and attains the fifth level at the time of data reading; and a second equalize signal which changes from a seventh level to an eighth level in response to the change of the address signal when the write signal is at the third level, attains the seventh level when an absolute value of a potential difference between the first and second signals lines is either one of the first and second predetermined voltages, changes from the seventh level to the eighth level in response to the change of the address signal at the time of data writing, and changes from the eighth level to the seventh level in response to the write signal changing from the fourth level to the third level.

The plurality of first signal line equalizing circuits are provided corresponding respectively to the plurality of signal line pairs, and each circuit receives the first equalize signal for equalizing potentials on the third and fourth signal lines when the first equalize signal is at the sixth level and stopping equalization when the first equalize signal is at the fifth level.

The second signal line equalizing circuit is connected to the first and second signal lines, and receives the second equalize signal for equalizing potentials on the first and second signal lines when the second equalize signal is at the seventh level and stopping equalization when the second equalize signal is at the eight level.

At the time of data reading, the write signal is at the third level and the first equalize signal output from the equalize signal generating circuit remains at the fifth level, so that the first signal line equalizing circuit does not carry out equalization of the third and fourth signal lines.

In the meanwhile, the second equalize signal output from the equalize signal generating circuit changes from the seventh level to the eighth level in response to the change of the address signal. In response to this, the second signal line equalizing circuit stops equalizing of the first and second signal lines.

Therefore, at the time of data reading, only equalization of the first and second signal lines is carried out, and equalization of the third and fourth signal lines is not carried out, whereby an insufficient output of the read data due to a transfer delay of the equalize signal to the first signal line equalizing circuit provided corresponding to the signal line pair consisting of the third and fourth signal lines disposed far from the equalize signal generating circuit can be prevented. Therefore, time required to read data after input of an address can be shortened, thus preventing increase in access time due to a signal delay.

Further, in operation, potentials corresponding to data from the memory cell are output to the first and second signal lines. The amplifying circuit receiving the potentials on these signal lines outputs read data having the level corresponding to the potential difference between the first and second signal lines. The read data attains the first level when the potential on the first signal line is higher than that on the second signal line by at least the first predetermined voltage, and attains the second level when the potential on the first signal line is lower than that on the second signal line by at least the second predetermined potential.

The second equalize signal output from the equalize signal generating circuit attains the seventh level when the absolute value of the potential difference between the first and second signal lines attains either one of the first and second predetermined voltages. In other words, the second equalize signal attains the seventh level in response to the amplifying circuit attaining such a voltage as to allow output of read data having either the first level or the second level.

Accordingly, the second signal line equalizing circuit receiving the second equalize signal starts equalization of the first and second signal lines, whereby the potential difference between the first and second signal lines can be prevented from reaching to the maximum value, and at the same time equalization for the subsequent operation can be completed. Thus, time required to read data after input of the subsequent address can be shortened.

Also, the write signal changes from the third level to the fourth level at the time of data writing, and changes from the fourth level to the third level after completion of writing. The first equalize signal output from the equalize signal generating circuit changes from the fifth level to the sixth level to hold the sixth level for a predetermined period in response to the write signal changing from the fourth level to the third level. In response to this, the first signal line equalizing circuit carries out equalization of the third and fourth signal lines for a predetermined period.

The second equalize signal output from the equalize signal generating circuit changes from the seventh level to the eighth level in response to the change of the address signal. In response to this, the second signal line equalizing circuit stops equalizing the first and second signal lines.

After writing the data, the second equalize signal changes from the eighth level to the seventh level in response to the write signal changing from the fourth level to the third level. In response to this, the second signal line equalizing circuit carries out equalization of the first and second signal lines.

As described above, equalization is carried out by both the first and second signal line equalizing circuits after the potential difference between the first and second signal lines and the potential difference between the third and fourth signal lines connected to the first and second signal lines reach the maximum values at the time of data writing, thus accelerating equalization of the first and second signal lines and the third and fourth signal lines connected to the first and second signal lines. Therefore, time required to read data after input of the subsequent address can be shortened.

Thus, the semiconductor memory device according to this aspect can shorten access time, and among others, the device can prevent increase in access time due to a signal delay when input/output lines are formed hierarchically.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6a–6f are timing charts showing operations of the semiconductor memory device shown in FIG. 5.

FIG. 13a–13m are timing charts showing operations of the semiconductor memory device shown in FIG. 12.

DESCRIPTION OF THE PREFERRED EMBODIMENTS

Embodiment 1

Figure 1:
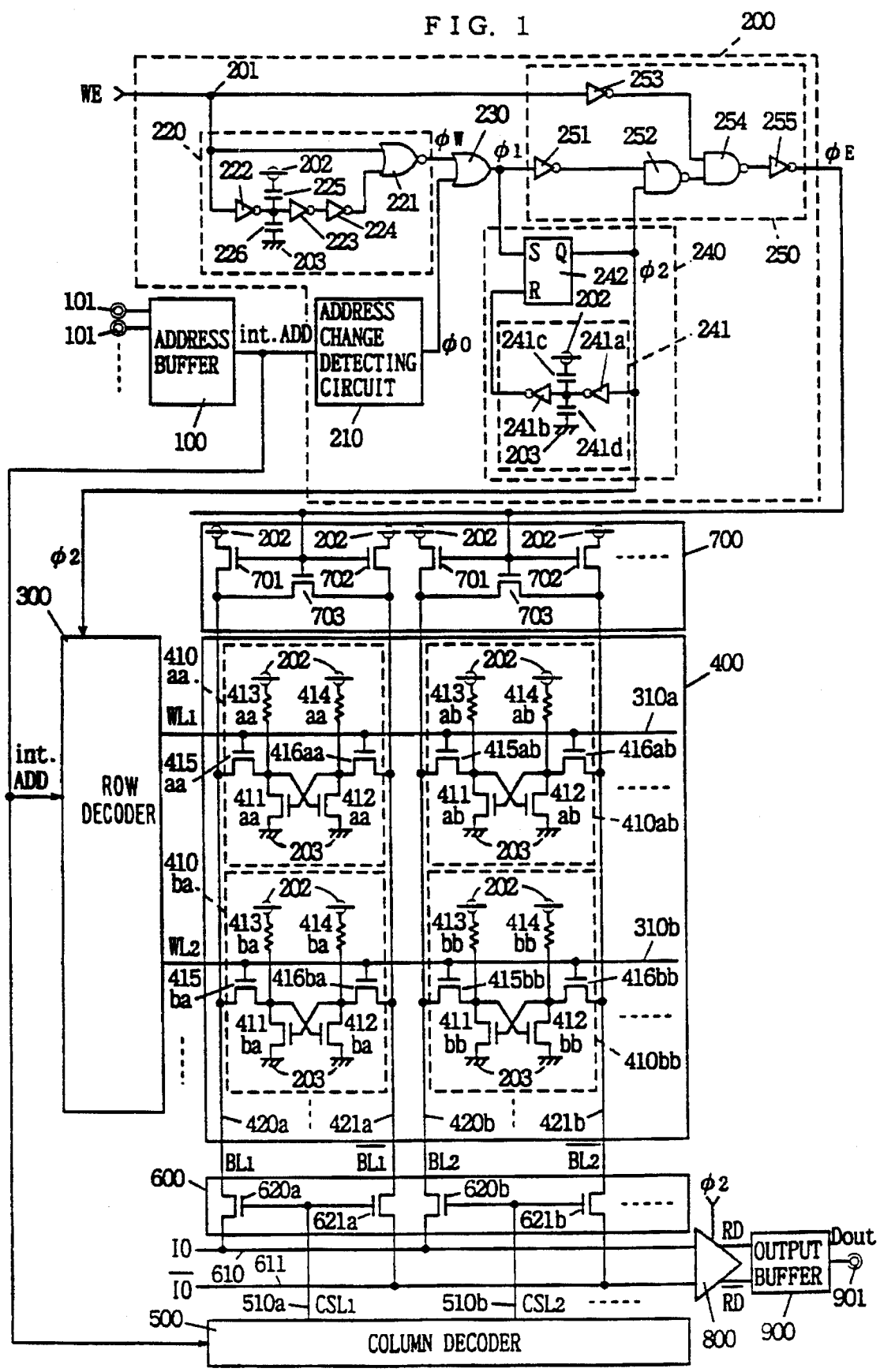
FIG. 1 is a circuit diagram showing a structure of a semiconductor memory device according to a first embodiment of the present invention.

Now, a first embodiment of the present invention will be described. FIG. 1 is a circuit diagram showing a structure of a semiconductor memory device according to the first embodiment.

With reference to FIG. 1, an address buffer 100 receives an externally applied address signal ADD via an address pin 101 and outputs an internal address signal intADD for an internal circuit. An equalize signal generating circuit 200 includes an address change detecting circuit 210, a write termination detecting circuit 220, an OR circuit 230, a first signal generating circuit 240, and a second signal generating circuit 250.

Equalize signal generating circuit 200 receives a write signal WE which attains the H level at the time of writing and attains the L level at the time of reading, and internal address signal intADD applied from address buffer 100. Also, equalize signal generating circuit 200 outputs an equalize signal $\phi_E$ which changes from the H level to the L level in response to a change of internal address signal intADD at the time of reading, and then attains the H level again.

In equalize signal generating circuit 200, address change detecting circuit 210 receives internal address signal intADD applied from address buffer 100 and outputs an address change signal $\phi_0$ which attains the H level for predetermined period in response to a change of the internal address signal intADD.

Write termination detecting circuit 220 includes an NOR circuit 221, inverters 222, 223, 224 and capacitors 225, 226. NOR circuit 221 has one input node connected to a node 201 receiving write signal WE. Inverters 222, 223, and 224 are connected in series between node 201 and the other input node of NOR circuit 221.

A power supply potential $V_{CC}$ is applied to a power supply potential node 202. The ground potential is applied to a ground potential node 203. Capacitor 225 is connected between power supply potential node 202 and an output node of inverter 222. Capacitor 226 is connected between the output node of inverter 222 and ground potential node 203.

As described above, write termination detecting circuit 220 receives write signal WE, and outputs from NOR circuit 221 a write termination signal $\phi_W$ which attains the H level for a predetermined period in response to falling of write signal WE from the H level to the L level.

OR circuit 230 receives address change signal $\phi_0$ applied from address change detecting circuit 210 and write termination signal $\phi_W$ applied from write termination detecting circuit 220. OR circuit 230 outputs a signal $\phi_1$ which attains the H level when at least one of the input signals is at the H level.

The first signal generating circuit 240 includes a delay circuit 241 and an R-S flipflop circuit 242. Delay circuit 241 includes inverters 241a and 241b, and capacitors 241c and 241d. R-S flipflop circuit 242 receives signal $\phi_1$ applied from OR circuit 230 at a node (S) on a set input side, and a first signal $\phi_2$ output from a set priority output node (Q) through delay circuit 241 at a node (R) on a reset input side.

As described above, first signal generating circuit 240 receives signal $\phi_1$ and a signal (a delay signal) obtained by internally generated first signal $\phi_2$ passing through delay circuit 241. Then, first signal generating circuit 240 outputs first signal $\phi_2$ which changes from the L level to the H level in response to signal $\phi_1$ changing from the L level to the H level, and changes from the H level to the L level in response to the delay signal changing from the L level to the H level.

The second signal generating circuit 250 includes inverters 251, 253 and 255, and NAND circuits 252 and 254. In the second signal generating circuit, inverter 251 receives signal $\phi_1$ at an input node. NAND circuit 252 receives an output from inverter 251 at one input node and first signal $\phi_2$ at the other input node. Inverter 253 receives write signal WE at an input node. NAND circuit 254 receives an output from inverter 253 at one input node and an output from NAND circuit 252 at the other input node. Inverter 255 receives an output from NAND circuit 254 at an input node and outputs equalize signal $\phi_E$.

As described above, the second signal generating circuit receives signal $\phi_1$ applied from OR circuit 230, first signal $\phi_2$ applied from first signal generating circuit 240, and write signal WE. Then, second signal generating circuit 250 outputs equalize signal $\phi_E$ which attains the H level when write signal WE is at the L level and at the same time signal $\phi_1$ is at the H level or first signal $\phi_2$ is at the L level, and which attains the L level when write signal WE is at the H level or signal $\phi_1$ is at the L level and at the same time first signal $\phi_2$ is at the H level.

A row decoder 300 receives first signal $\phi_2$ applied from equalize signal generating circuit 200 and internal address signal intADD applied from address buffer 100. Then, row decoder 300 raises one of potentials $WL_1$, $WL_2$, ... on a plurality of word lines 310 (general designation for 310a, 310b, ... ) from the L level to the H level in response to internal address signal intADD when first signal $\phi_2$ is at the H level. On the contrary, when first signal $\phi_2$ is at the L level, row decoder 300 renders all word lines 310 to attain the L level.

A memory cell array 400 includes a plurality of memory cells 410 (general designation for 410aa, 410ab, ... ), a plurality of word lines 310 (general designation for 310a, 310b, ... ), and a plurality of bit line pairs 420 and 421 (general designation for 420a and 421a, 420b and 421b, ... ). In memory cell array 400, a memory cell 410 is provided corresponding to each crossing of word line 310 and bit line pair 420 and 421, thus disposing memory cells 410 in a matrix manner. Word line 310 and bit line pairs 420 and 421 are connected respectively to memory cell 410.

Each of the plurality of memory cells 410 includes two driver transistors 411 and 412 (general designation for 411aa, 411ab, ... , and general designation for 412aa, 412ab, ... ), two resistors of a high load type 413 and 414 (general designation for 413aa, 413ab, ... , and general designation for 414aa, 414ab, ... ), and two access transistors 415 and 416 (general designation for 415aa, 415ab, ... , and general designation for 416aa, 416ab, ... ).

Both driver transistors 411 and 412 have their source electrodes connected to a ground potential node 203, one gate electrode connected to the other drain electrode, and the other gate electrode connected to one drain electrode. Resistor 413 is connected between power supply potential node 202 and the drain electrode of driver transistor 411. Resistor 414 is connected between power supply potential node 202 and the drain electrode of driver transistor 412.

Access transistor 415 is connected between bit line 420 and the drain electrode of driver transistor 411, and has its gate electrode connected to word line 310. Access transistor 416 is connected between bit line 421 and the drain electrode of driver transistor 412, and has its gate electrode connected to word line 310.

A column decoder 500 receives internal address signal intADD applied from address buffer 100, and raises one of potentials $CSL_1$, $CSL_2$, ... on a plurality of column selection lines 510 (general designation for 510a, 510b, ... ) from the L level to the H level in response to internal address signal intADD.

An I/O gate circuit 600 includes a pair of two n channel MOS transistors 620 and 621 (general designation for 620a and 621a, 620b and 621b, ... ). In I/O gate circuit 600, transistors 620 and 621 are respectively connected between bit line pairs 420 and 421 and I/O line pair 610 and 611. I/O gate circuit 600 of such a structure transfers one of potential pairs $BL_1$ and $\overline{BL_1}$, $BL_2$ and $\overline{BL_2}$, ... on bit line pairs 420 and 421 to I/O line pair 610 and 611.

A bit line equalizing circuit 700 includes transistors for precharging 701 and 702 and a transistor for equalization 703 corresponding to each bit line pair. In bit line equalizing circuit 700, precharging transistor 701 is connected between power supply potential node 202 and bit line 420 and receives equalize signal $\phi_E$ at its gate electrode. Precharging transistor 702 is connected between power supply potential node 202 and bit line 421 and receives equalize signal $\phi_E$ at its gate electrode.

Equalizing transistor 703 is connected between bit line 420 and bit line 421 and receives equalize signal $\phi_E$ at its gate electrode. Each of precharging transistors 701 and 702 has a threshold voltage of $V_{th}$.

As described above, bit line equalizing circuit 700 receives equalize signal $\phi_E$ output from equalize signal generating circuit 200, and equalizes potentials on bit line pairs 420 and 421 to a potential $V_{CC}$-$V_{th}$ which is lower than power supply potential $V_{CC}$ by threshold voltage $V_{th}$ when equalize signal $\phi_E$ almost attains power supply potential $V_{CC}$ (the H level).

A differential amplifying circuit 800 receives first signal $\phi_2$ applied from equalize signal generating circuit 200 and potentials IO and $\overline{IO}$ on I/O lines 610 and 611. Differential amplifying circuit 800 amplifies a potential difference between I/O line pair 610 and 611 when first signal $\phi_2$ is at the H level to output read data RD and $\overline{RD}$, while the circuit latches read data RD and $\overline{RD}$ when first signal $\phi_2$ is at the L level. An output buffer circuit 900 receives read data RD and $\overline{RD}$ applied from differential amplifying circuit 800, and in response to this, outputs an output data $D_{out}$ to an output pin 901.

Figure 2:
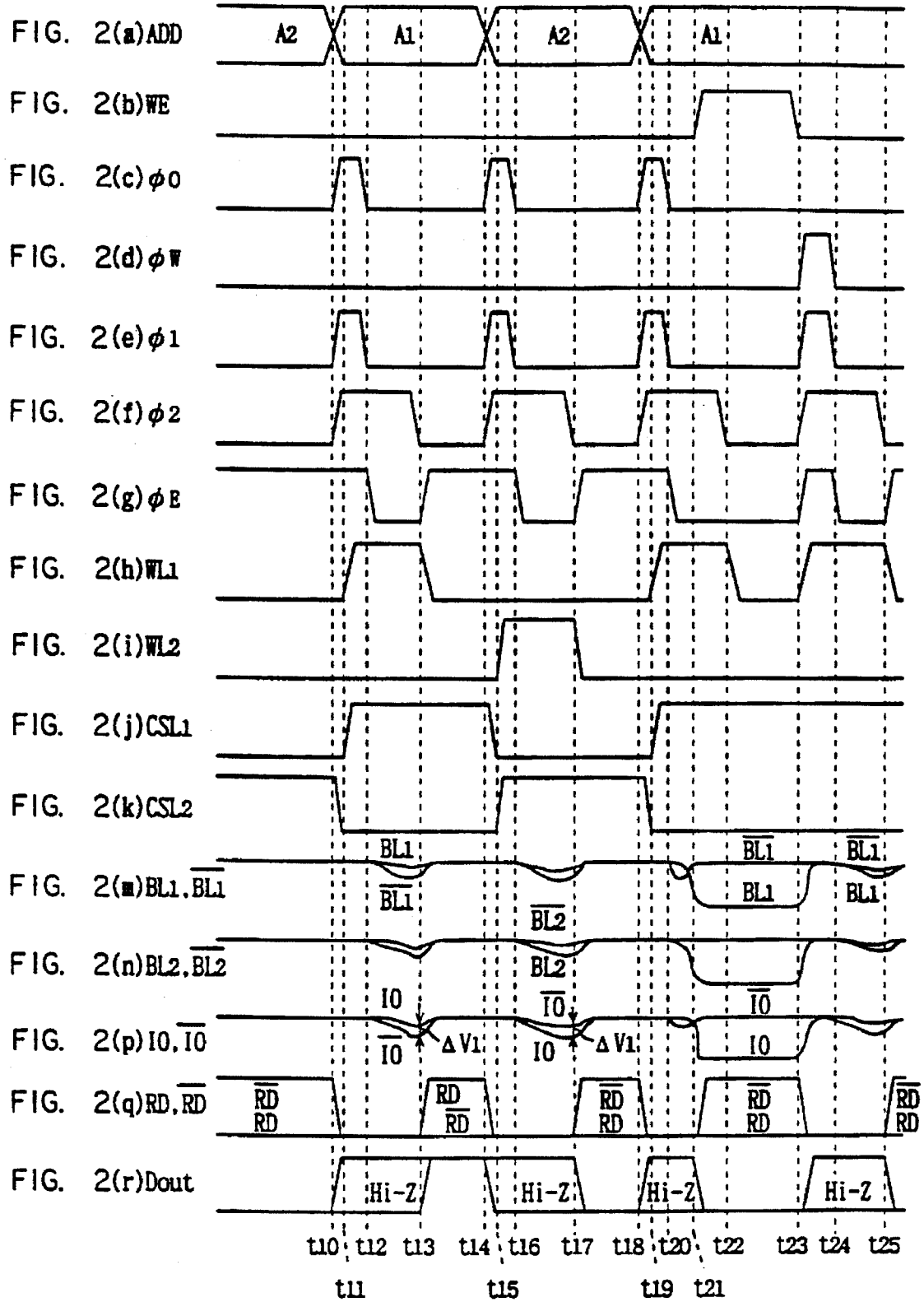
FIG. 2a–2r are timing charts showing operations of the semiconductor memory device shown in FIG. 1.

Now, operations of the semiconductor memory device of the above-described structure shown in FIG. 1 will be described. FIG. 2 is a timing chart showing operations of the semiconductor memory device shown in FIG. 1. The following description of operations is based on the timing chart shown in FIG. 2.

It is assumed that data having the H level and the L level are respectively stored in memory cells 410aa and 410bb in memory cell 410 shown in FIG. 1. Also, it is assumed that the data having the L level is initially read from memory cell 410bb.

After reading of data at the L level, operations for reading data at the H level from memory cell 410aa, reading data at the L level again from memory cell 410bb, and then writing data at the L level in memory cell 410aa will be specifically described below.

First, as shown in FIG. 2(a), a state before time $t_{10}$ when an externally applied address signal ADD changes from $A_2$ to $A_1$ will be described.

In this case, equalize signal $\phi_E$ output from equalize signal generating circuit 200 is at the H level as shown in FIG. 2(g). Accordingly, precharging transistors 701, 702 and equalizing transistor 703 receiving equalize signal $\phi_E$ at their gates are respectively rendered conductive. Therefore, potentials $BL_1$ and $\overline{BL_1}$, $BL_2$ and $\overline{BL_2}$, ... on bit lines 420 and 421 are equalized to a value of $V_{CC}$-$V_{th}$ as shown in FIG. 2(m) and (n).

In the meanwhile, first signal $\phi_2$ output from equalize signal generating circuit 200 is at the L level as shown in FIG. 2(f), so that row decoder 300 receiving first signal $\phi_2$ renders all the potentials $WL_1$, $WL_2$, ... on word lines 310 to attain the L level, as shown in FIG. 2(h) and (i).

In response to this, access transistors 415 and 416 in memory cell 410 are all rendered non-conductive. Therefore, no current is flown from precharging transistors 701 and 702 to memory cell 410 via bit lines 420 and 421, respectively.

In the meanwhile, column decoder 500 raises potential $CSL_2$ on column selection line 510b corresponding to address signal $A_2$ to the H level as shown in FIG. 2(k), whereby n channel MOS transistors 620b and 621b receiving potential $CSL_2$ at the gate electrodes in I/O gate circuit 600 are rendered conductive.

Therefore, bit lines 420b and 421b are respectively connected to I/O lines 610 and 611 through n channel MOS transistors 620b and 621b, thus equalizing potentials IO and $\overline{\text{IO}}$ on I/O lines 610 and 611 as shown in FIG. 2(p).

Differential amplifying circuit 800 receiving first signal $\phi_2$ having the L level latches read data RD having the L level and read data $\overline{\text{RD}}$ having the H level for output as shown in FIG. 2(q). Output buffer circuit 900 outputs output data $D_{out}$ having the L level to output pin 901 as shown in FIG. 2(r).

Then, as shown in FIG. 2(a), when externally applied address signal ADD changes from $A_2$ to $A_1$ at time $t_{10}$, in response to this, internal address signal intADD output from address buffer 100 is changed. In response to this, address change detecting circuit 210 receiving internal address signal intADD outputs address change signal $\phi_0$ which attains the H level for a predetermined period until time $t_{12}$, as shown in FIG. 2(c).

In the meanwhile, since write signal WE remains at the L level, write termination signal $\phi_W$ output from write termination detecting circuit 220 remains at the L level as shown in FIG. 2(d). OR circuit 230 receiving write termination signal $\phi_W$ and address change signal $\phi_0$ having the H level outputs signal $\phi_1$ which attains the H level for a predetermined period as shown in FIG. 2(e). R-S flipflop circuit 242 in first signal generating circuit 240 receives signal $\phi_1$ at the set input, and in response to this, outputs first signal $\phi_2$ which rises from the L level to the H level, as shown in FIG. 2(f).

Inverter 251 in second signal generating circuit 250 outputs to NAND circuit 252 a signal having the L level which is obtained by inverting signal $\phi_1$ having the H level. In response to this, NAND circuit 252 outputs a signal having the H level to NAND circuit 254. NAND circuit 254 also receives from inverter 253 a signal having the H level which is obtained by inverting write signal WE having the L level, and outputs a signal having the L level to inverter 255. Equalize signal $\phi_E$ output from inverter 255 remains at the H level, as shown in FIG. 2(g).

Precharging transistors 701, 702 and equalizing transistor 703 receiving equalize signal $\phi_E$ at the gate electrodes remains conductive. And potentials $BL_1$ and $\overline{BL_1}$, $BL_2$ and $\overline{BL_2}$, ... on bit lines 420 and 421 are still equalize to $V_{CC}-V_{th}$, as shown in FIG. 2(m) and (n).

On the other hand, row decoder 300 raises potential $WL_1$ on word line 310a to the H level at time $t_{11}$ in response to address signal ADD changing from $A_2$ to $A_1$ at time $t_{10}$, as shown in FIG. 2(h). In response to this, access transistors 415aa and 416aa in memory cell 410aa are rendered conductive, respectively.

At this time, as shown in FIG. 2(m), potentials $BL_1$ and $\overline{BL_1}$ on bit lines 420a and 421a are equalized. However, since respective ON resistance of access transistors 415aa and 416aa are relatively large, potentials at respective drain electrodes of driver transistors 411aa and 412aa remain at the H level and the L level, respectively.

In response to address signal ADD changing from $A_2$ to $A_1$ at time $t_{10}$, column decoder 500 causes potential $CSL_2$ on column selection line 510b to fall to the L level at a time substantially equal to time $t_{11}$ as shown in FIG. 2(k), and raises potential $CSL_1$ on column selection line 510a to the H level as shown in FIG. 2(j).

In response to this, n channel MOS transistors 620a and 621a in I/O gate circuit 600 are respectively rendered conductive. This causes bit lines 420a and 421a to be connected to I/O lines 610 and 611, respectively. Therefore, potentials IO and $\overline{\text{IO}}$ on I/O lines 610 and 611 are equalized as shown in FIG. 2(p).

Further, in response to first signal $\phi_2$ attaining the H level, differential amplifying circuit 800 stops latching read data RD and $\overline{\text{RD}}$, and outputs read data RD and $\overline{\text{RD}}$ both having the L level as shown in FIG. 2(q). In response to both read data RD and $\overline{\text{RD}}$ attaining the L level, output buffer 900 outputs output data $D_{out}$ of a high impedance (Hi-Z) as shown in FIG. 2(r).

Then, as shown in FIG. 2(c), address change signal $\phi_0$ outputs from address change detecting circuit 210 falls to the L level at time $t_{12}$. In response to this, OR circuit 230 receiving address change signal $\phi_0$ and write termination signal $\phi_W$ having the L level outputs signal $\phi_1$ which falls to the L level, as shown in FIG. 2(e).

At this time, a delay time of delay circuit 241 has not yet passed. Therefore, first signal $\phi_2$ having the H level output from R-S flipflop circuit 242 in first signal generating circuit 240 is not input to the reset input of R-S flipflop circuit 242 through delay circuit 241 even though signal $\phi_1$ at the set input is changed. Thus, first signal $\phi_2$ remains at the H level as shown in FIG. 2(b).

Then, inverter 251 in second signal generating circuit 250 outputs to NAND circuit 252 a signal having the H level obtained by inverting signal $\phi_1$ having the L level.

NAND circuit 252 receiving first signal $\phi_2$ having the H level outputs to NAND circuit 254 a signal having the L level. Then, NAND circuit 254 outputs a signal having the H level to inverter 255. Equalize signal $\phi_E$ output from inverter 255 falls from the H to the L level as shown in FIG. 2(g).

Accordingly, precharging transistors 701, 702 and equalizing transistor 703 receiving equalize signal $\phi_E$ in bit line equalizing circuit 700 are respectively rendered non-conductive. Therefore, equalization of bit lines 420 and 421 is stopped, and potentials of the H level and the L level respectively held at the drain electrodes of driver transistors 411aa and 412aa in memory cell 410aa are read to bit lines 420a and 421a, respectively.

A potential difference is generated between potentials $BL_1$ and $\overline{BL_1}$ on bit lines 420a and 421a as shown in FIG. 2(m), thus defining a relationship between potentials on bit lines 420a and 421a as $BL_1 > \overline{BL_1}$. In response to this, the potential difference between potentials IO and $\overline{\text{IO}}$ on I/O lines 610 and 611 connected to bit lines 420a and 421a increases to reach $\Delta V_1$ at time $t_{13}$, as shown in FIG. 2(P).

Accordingly, as shown in FIG. 2(q), differential amplifying circuit 800 receiving potentials IO and $\overline{\text{IO}}$ on I/O lines 610 and 611 outputs read data RD which rises to the H level when the potential difference between potentials IO and $\overline{\text{IO}}$ attains $\Delta V_1$ and read data $\overline{\text{RD}}$ which is complementary to read data RD. Then, output buffer circuit 900 outputs to output pin 901 output data $D_{out}$ which attains the H level as shown in FIG. 2(r).

At the time substantially equal to or somewhat later than time $t_{13}$, first signal $\phi_2$ having the H level output from first signal generating circuit 240 is transferred to the reset input of R-S flipflop circuit 242 through delay circuit 241. First signal $\phi_2$ output from R-S flipflop circuit 242 is reset and fell to the L level from the H level, as shown in FIG. 2(f).

In response to this, NAND circuit 252 receiving first signal $\phi_2$ outputs a signal having the H level to NAND circuit 254. Also, NAND circuit 254 receives from inverter 253 a signal having the H level obtained by inverting write signal WE having the L level, and outputs a signal having the L level to inverter 255. Equalize signal $\phi_E$ output from inverter 255 rises from the L level to the H level as shown in FIG. 2(g).

Accordingly, precharging transistors 701, 702 and equalizing transistor 703 receiving equalize signal $\phi_E$ in bit line equalizing circuit 700 are respectively rendered conductive.

As a result, potentials on bit lines 420 and 421 are equalized as shown in FIG. 2(*m*) and (*n*). Also, potentials on I/O lines 610 and 611 connected to bit lines 420*a* and 421*a* are equalized in equalizing circuit 700 as shown in FIG. 2(*b*).

In response to first signal $\phi_2$ attaining the L level, differential amplifying circuit 800 latches read data RD having the H level and read data $\overline{\text{RD}}$ having the L level. Therefore, output data $D_{out}$ output from output buffer 900 remains at the H level. Also, in response to first signal $\phi_2$ attaining the L level, row decoder 300 renders all the potentials $WL_1$, $WL_2$, ... on word lines 310 to attain the L level as shown in FIG. 2(*h*) and (*i*).

Then, as shown in FIG. 2(*a*), when externally applied address signal ADD changes from $A_1$ to $A_2$ at time $t_{14}$, in response to this, internal address signal intADD output from address buffer 100 is changed.

Therefore, during a period from time $t_{14}$ to time $t_{17}$, address change signals $\phi_0$, $\phi_1$, first signal $\phi_2$, and equalize signal $\phi_E$ are respectively output by the same operations as in a period ranging from time $t_{10}$ to time $t_{13}$, as shown in FIG. 2(*c*), (*e*), (*f*) and (*g*).

Accordingly, row decoder 300 raises potential $WL_2$ on word line 310*b* to the H level in response to address signal ADD changing from $A_1$ to $A_2$ at time $t_{14}$, as shown in FIG. 2(*i*). In response to this, access transistors 415*bb* and 416*bb* in memory cell 410*bb* are respectively rendered conductive.

Also, column decoder 500 causes potential $CSL_1$ on column selection line 510*a* to fall to the L level at a time substantially equal to time $t_{15}$ in response to address signal ADD changing from $A_1$ to $A_2$ at time $t_{14}$, as shown in FIG. 2(*j*), and raises potential $CSL_2$ on column selection line 510*b* to the H level as shown in FIG. 2(*k*).

In response to this, n channel MOS transistors 620*b* and 621*b* in I/O gate circuit 600 are respectively rendered conductive, so that bit lines 420*b* and 421*b* are connected to I/O lines 610 and 611. Therefore, as shown in FIG. 2(*p*), potentials IO and $\overline{\text{IO}}$ on I/O lines 610 and 611 are equalized.

Differential amplifying circuit 800 releases latched read data RD and $\overline{\text{RD}}$ in response to first signal $\phi_2$ attaining the H level at time $t_{14}$, and outputs read data RD and $\overline{\text{RD}}$ both attaining the L level as shown in FIG. 2(*q*). Output buffer 900 outputs, in response to both read data RD and $\overline{\text{RD}}$ attaining the L level, output data $D_{out}$ of the high impedance (Hi-Z) as shown in FIG. 2(*r*).

Then, equalize signal $\phi_E$ falls to the L level at time $t_{16}$ as shown in FIG. 2(*g*). In response to this, precharging transistors 701, 702 and equalizing transistor 703 receiving equalize signal $\phi_E$ in bit line equalizing circuit 700 are respectively rendered non-conductive.

This stops equalization of bit lines 420 and 421, whereby potentials of the L level and the H level held at respective drain electrodes of driver transistors 411*bb* and 412*bb* in memory cell 410*bb* are read to bit lines 420*b* and 421*b*, respectively.

This generates a potential difference between potentials $BL_2$ and $\overline{BL_2}$ on bit lines 420*b* and 421*b*, as shown in FIG. 2(*n*) thus defining a relationship between these potentials as $BL_2 < \overline{BL_2}$.

In response to this, the potential difference between potentials IO and $\overline{\text{IO}}$ on I/O lines 610 and 611 connected to bit lines 420*b* ad 421*b* increases to reach $\Delta V_1$ at time $t_{17}$, as shown in FIG. 2(*p*). When the potential difference between potentials IO and $\overline{\text{IO}}$ attains $\Delta V_1$, differential amplifying circuit 800 receiving potentials IO and $\overline{\text{IO}}$ outputs read data RD which rises to the H level and read data RD having the L level which is complementary to read data $\overline{\text{RD}}$, as shown in FIG. 2(*q*). In response to this, output buffer circuit 900 outputs to output pin 901 output data $D_{out}$ which attains the L level as shown in FIG. 2(*r*).

Then, when address signal ADD changes from $A_2$ to $A_1$ at time $t_{18}$ as shown in FIG. 2(*a*), in a period ranging from time $t_{18}$ to time $t_{22}$ address change signal $\phi_0$, signal $\phi_1$, and first signal $\phi_2$ are respectively output by the same operations as in a period ranging from time $t_{10}$ to time $t_{13}$, as shown in FIG. 2(*c*), (*e*) and (*f*).

Also, word line 310*a* and column selection line 510*a* are selected by the same operations as in the period ranging from time $t_{10}$ to time $t_{13}$, as shown in FIG. 2(*h*)–(*k*). Equalize signal $\phi_E$ is provided at a level similar to that of data read out in a period until time $t_{21}$, as shown in FIG. 2(*e*).

However, if write signal WE attains the H level at time $t_{21}$, then NAND circuit 254 receiving an inverted write signal WE output from inverter 253 in equalize signal generating circuit 200 outputs a signal at the H level even if first signal $\phi_2$ attains the L level at time $t_{22}$. Inverter 255 receives an output signal of NAND circuit 254, and outputs equalize signal $\phi_E$ remaining at the L level, as shown in FIG. 2(*g*). Bit line equalizing circuit 700 stops equalizing bit lines 420 and 421.

As described above, after memory cell 410*aa* is selected, and connected to I/O lines 610 and 611 via bit lines 420*a* and 421*a*, write signal WE rises to the H level at time $t_{21}$. In response to this, potentials at the L level and the H level are applied to I/O lines 610 and 611 by a data buffer (not shown), as shown in FIG. 2(*p*).

This causes the potential difference between potentials IO and $\overline{\text{IO}}$ to increase to the maximum value, thus rendering bit lines 420*a* and 421*a* connected to I/O lines 610 and 611 to attain the L level and the H level, as shown in FIG. 2(*m*).

Then, as shown in FIG. 2(*b*), write signal WE changes from the H level to the L level at time $t_{23}$, whereby the inverted write signal inverted by inverter 253 and first signal $\phi_2$ attain the L level. Accordingly, NAND circuit 254 receives an output signal from NAND circuit 252, and outputs a signal at the L level. Inverter 255 receives an output signal from NAND circuit 254, and outputs equalize signal $\phi_E$ which rises to the H level, as shown in FIG. 2(*g*).

In response to the change of write signal WE from the H level to the L level, write termination detecting circuit 220 outputs write termination signal $\phi_W$ which attains the H level only for a predetermined period until time $t_{24}$, as shown in FIG. 2(*d*), to OR circuit 230. Accordingly, OR circuit 230 outputs signal $\phi_1$ which attains the H level for a predetermined period, as shown in FIG. 2(*e*). In response to signal $\phi_1$ changing to the H level, R-S flipflop circuit 242 in first signal generating circuit 240 is set, whereby first signal $\phi_2$ attains the H level as shown in FIG. 2(*f*).

Row decoder 300 receiving first signal $\phi_2$ renders potential $WL_1$ on word line 310*a* to attain the H level as shown in FIG. 2(*h*). As shown in FIG. 2(*e*), when signal $\phi_1$ attains the L level at time $t_{24}$, equalize signal $\phi_E$ attains the L level, and the data having the L level which has just been written in memory cell 410*aa* is read to I/O lines 610 and 611 via bit lines 420*a* and 421*a*.

As in the reading operation, when read data $\overline{\text{RD}}$ attains the H level, equalize signal $\phi_E$ again attains the H level. In response to this, bit lines 420 and 421 are equalized by bit line equalizing circuit 700, so that potentials on bit lines 420 and 421 become equal as shown in FIG. 2(*m*) and (*n*).

As described above, in the first embodiment, when the potential difference between potentials IO and $\overline{\text{IO}}$ on I/O lines 610 and 611 attains $\Delta V_1$ which is sufficient for differential amplifying circuit 800 to detect whether the data which is read to I/O lines 610 and 611 being at the H level or the L level, in other words, when read data RD and $\overline{RD}$ output from the differential amplifying circuit 800 attain the H level and the L level or attain the L level and the H level, equalize signal $\phi_E$ is rendered to attain the H level for starting equalization.

This prevents increase of the potential difference between I/O lines 610 and 611 from reaching to the maximum value, and at the same time, equalization for the subsequent operation can be completed in advance, whereby time required to read the subsequent data can be shortened.

Also, by adjusting the delay time of delay circuit 241 such that a timing by which equalize signal $\phi_E$ attains the H level and starts equalization can be set at an optimum value, increase of the potential difference between I/O lines 610 and 611 can easily be prevented from reaching to the maximum value. In this case it is sufficient to set the optimum value of the delay time depending on a result of simulation.

In the meanwhile, row decoder 300 renders all potentials on word lines 310 to attain the L level when first signal $\phi_2$ is at the L level, and does not connect the memory cell to bit lines 420 and 421. Therefore, if first signal $\phi_2$ attains the L level and equalize signal $\phi_E$ rises the H level so as to start equalization of bit lines 420 and 421, no current is flown to memory cell 410 from bit lines 420 and 421, whereby power consumption can be reduced.

Embodiment 2

Figure 3:
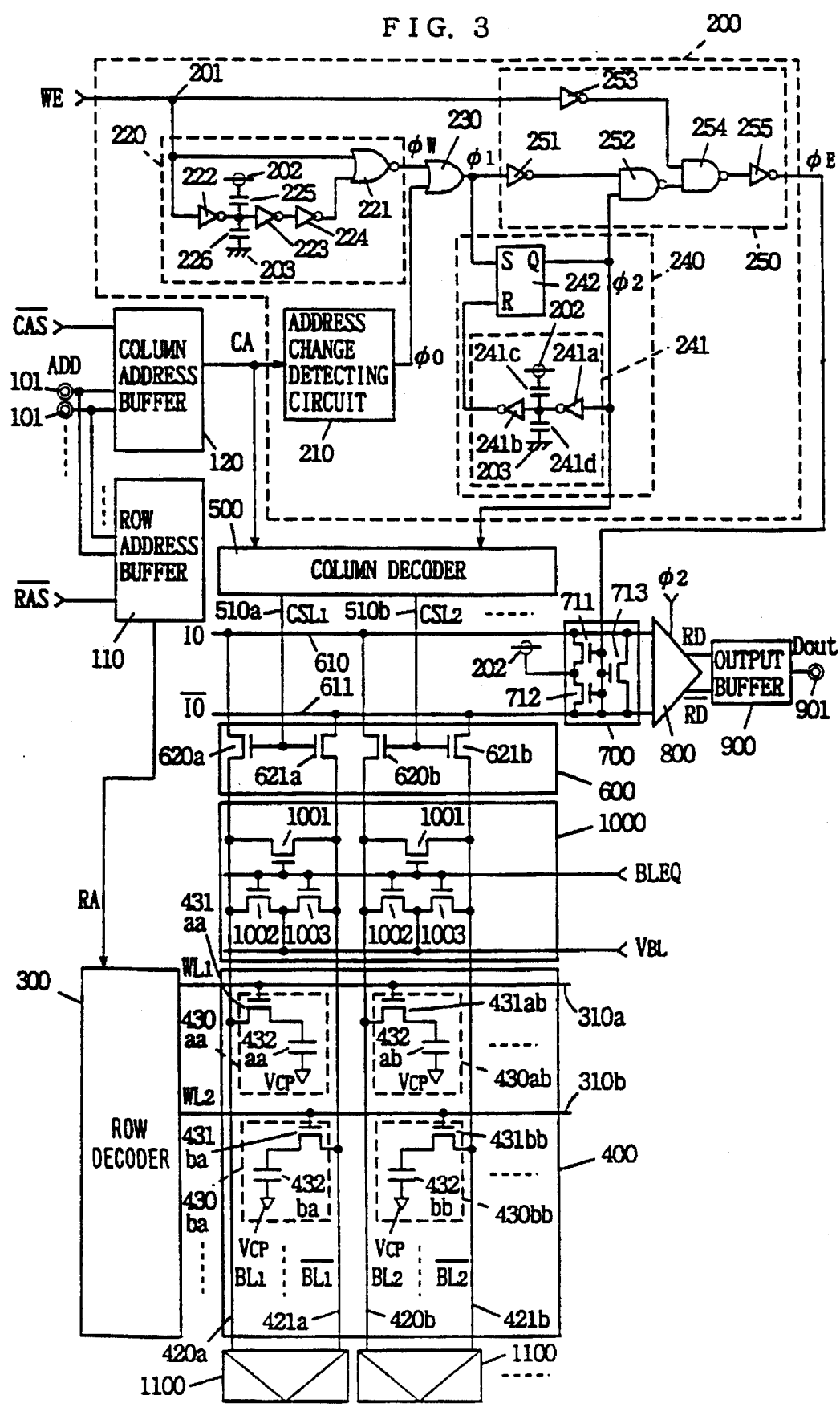
FIG. 3 is a circuit diagram showing a structure of a semiconductor memory device according to a second embodiment of the present invention.

Now, a second embodiment of the present invention will be described. In the second embodiment, equalize signal generating circuit 200 shown in FIG. 1 is applied for equalization of I/O lines during page mode operation of a DRAM (Dynamic Random Access Memory). FIG. 3 is a circuit diagram showing a structure of a semiconductor memory device according to the second embodiment. The following description is mainly given for describing a difference between semiconductor memory device shown in FIG. 3 and that shown in FIG. 1.

With reference to FIG. 3, a row address buffer 110 receives a row address strobe signal $\overline{RAS}$ and an address signal ADD applied from an address pin 101. Row address buffer 110 takes in address signal ADD as a row address and outputs an internal row address signal RA in response to falling of row address strobe signal $\overline{RAS}$ to the L level.

A column address buffer 120 receives a column address strobe signal $\overline{CAS}$ and address signal ADD applied from address pin 101. Column address buffer 120 takes in address signal ADD as a column address and outputs an internal column address signal CA in response to falling of column address strobe signal $\overline{CAS}$ to the L level.

Equalize signal generating circuit 200 shown in FIG. 3 is different from that shown in FIG. 1 in an address change detecting circuit 210. More particularly, address change detecting circuit 210 shown in FIG. 1 detects changes of all address signals ADD, while address change detecting circuit 210 shown in FIG. 3 detects only a change of column address signal CA applied from column address buffer 120. Address change detecting circuit 210 outputs an address change signal $\phi_0$ which attains the H level for a predetermined period.

A memory cell 430 (general designation for 430aa, 430ab, . . . ) includes a memory transistor 431 (general designation for 431aa, 431ab, . . . ) and a capacitor 432 (general designation for 432aa, 432ab, . . . ). An I/O equalizing circuit 700 includes n channel MOS transistors 711, 712 and 713.

Transistor 711 is connected between an I/O line 610 and a power supply potential node 202, and receives equalize signal $\phi_E$ at its gate electrode. Transistor 712 is connected between an I/O line 611 and a power supply potential node 202, and receives equalize signal $\phi_E$ at its gate electrode. Transistor 713 is connected between I/O lines 610 and 611 and receives equalize signal $\phi_E$ at its gate electrode. I/O line equalizing circuit 700 is provided for equalizing potentials on I/O lines 610 and 611 by operation of respective transistors 711–713.

A bit line equalizing circuit 1000 includes transistors 1001–1003 connected between bit line pairs 420 and 421 (general designation for 420a, 420b, . . . , and general designation for 421a, 421b, . . . ). These transistors 1001–1003 receive a bit line equalize signal BLEQ at their gate electrodes, and in response to this signal, precharge or equalize bit lines 420 and 421 at $V_{BL}$ ($=\frac{1}{2} V_{CC}$). A sense amplifier 1100 is connected to bit lines 420 and 421 and detects and amplifies a potential difference therebetween.

Figure 4:
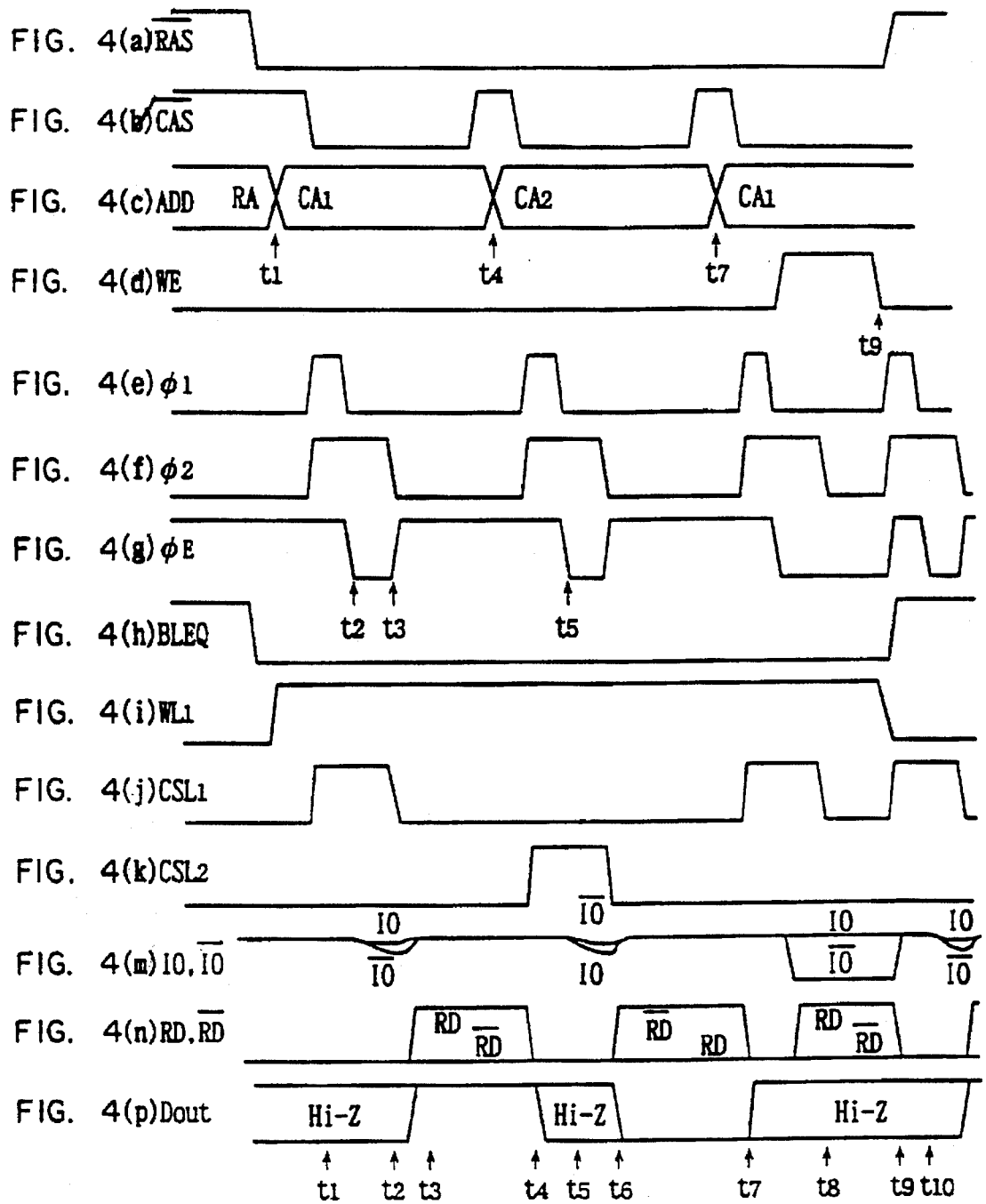
FIG. 4a–4p are timing charts showing operations of the semiconductor device shown in FIG. 3.

Now, operations of the semiconductor memory device shown in FIG. 3 will be described. FIG. 4 is a timing chart showing operations of the semiconductor memory device shown in FIG. 3. The operations will be described based on the timing chart shown in FIG. 4.

It is assumed that memory cell 430aa holds data at the H level and memory cell 430ab holds data at the L level. Therefore, data read to bit lines 420 and 421 by word line 310a are amplified by sense amplifier 1100.

This renders potentials $BL_1$, $\overline{BL_1}$, $BL_2$, $\overline{BL_2}$ on respective bit lines 420a, 421a, 420b, and 421b to attain the H level, the L level, the L level and the H level, respectively.

In response to the change of the column address to $CA_1$ at time $t_1$, an output signal $\phi_0$ from address change detecting circuit 210 and a first signal $\phi_2$ which is an output signal from an R-S flipflop circuit 242 and serves as a signal for activating a column decoder attain the H level, respectively, as in the case of FIG. 1. In response to this, a column selection line 510a attains the H level for a predetermined period. In response to this, potential $CSL_1$ on column selection line 510a attains the H level for a predetermined period. Accordingly, bit line pair 420a and 421a are connected to I/O line pair 610 and 611, respectively.

In response to signal $\phi_1$ attaining the L level at time $t_2$, equalize signal $\phi_E$ attains the L level, thus generating a potential difference between I/O line pair 610 and 611. Accordingly, a differential amplifying circuit 800 amplifies the potential difference between I/O line pair 610 and 611 to cause read data RD to attain the H level.

Then, in response to first signal $\phi_2$ attaining the L level at time $t_3$, equalize signal $\phi_E$ attains the H level, whereby I/O line pair 610 and 611 are short-circuited. When the column address changes to $CA_2$ at time $t_4$, potential $CSL_2$ on column selection line 510b attains the H level by the same operation as described in the above. In this case, since I/O line pair 610 and 611 are sufficiently equalized, data is transferred to I/O line pair 610 and 611 immediately after equalize signal $\phi_E$ changes to the L level at time $t_5$.

When the column address changes to $CA_1$ at time $t_7$, potential $CSL_1$ on column selection line 510a attains the H level by the same operation as described in the above. In this case, writing is carried out. In response to write signal WE attaining the H level, equalize signal $\phi_E$ attains the L level, whereby the write data is transferred to I/O line pair 610 and 611.

In response to write signal WE attaining the L level at time $t_9$, output signal $\phi_W$ from write termination signal generating circuit 220 attains the H level. In response to this, first signal $\phi_2$ attains the H level whereby potential $CSL_1$ on column selection line 610 attains the H level for a predetermined period, and at the same time equalize signal $\phi_E$ attains the H level. Therefore, I/O line pair 610 and 611 in which the potential difference is increased due to writing are short-circuited. This allows preparation for the subsequent reading operation.

As described above, the address change detecting circuit shown in FIG. 1 is applicable to the DRAM shown in FIG. 3. Thus, the same effect as in the first embodiment can be obtained in the second embodiment.

Embodiment 3

Figure 5:
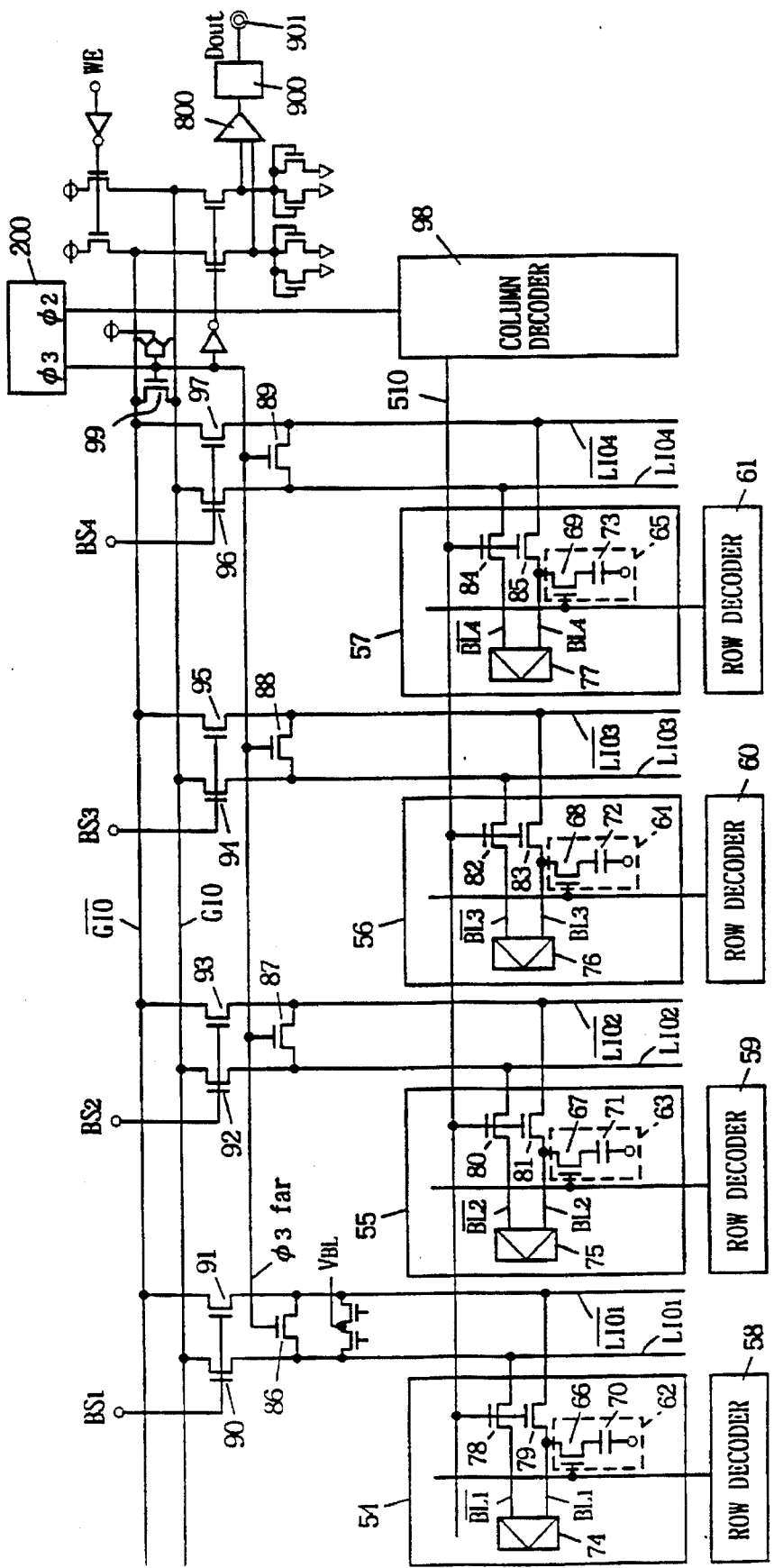
FIG. 5 is a circuit diagram showing a structure of a semiconductor memory device according to a third embodiment of the present invention.

Now, a third embodiment will be described in which equalize signal generating circuit 200 as shown in FIGS. 1 and 3 is applied to the DRAM cooperating a column decoder in a plurality of memory cell blocks for high integration. FIG. 5 is a circuit diagram showing a structure of a semiconductor memory device according to the third embodiment.

With reference to FIG. 5, in the semiconductor memory device, a plurality of memory cell arrays 54–57 are disposed along an extending direction of main I/O line pair GIO and $\overline{GIO}$. These memory cell arrays 54–57 share a column decoder 98. In other words, column decoder 98 is shared with the plurality of memory cell blocks.

Row decoders 58–61 are provided corresponding to respective memory cell arrays 54–57. Corresponding to respective memory cell arrays 54–57, memory cells 62–65, bit line pairs $BL_1$ and $\overline{BL_1}$-$BL_4$ and $\overline{BL_4}$, sense amplifiers 74–77 and n channel MOS transistor pairs 78 and 79–84 and 85 disposed on each bit line are provided. Each memory cell 62–65 includes one memory cell transistor (66–69) and one capacitor (70–73).

Sub I/O line pairs $LIO_1$ and $\overline{LIO_1}$-$LIO_4$ and $\overline{LIO_4}$ are provided corresponding to respective memory cell arrays 54–57. These sub I/O line pairs $LIO_1$ an $\overline{LIO_1}$-$LIO_4$ and $\overline{LIO_4}$ are connected to main I/O line pair GIO and $\overline{GIO}$ through n channel MOS transistor pairs 90 and 91–96 and 97. Also, in each memory cell arrays 54–57, bit line pairs are connected to corresponding sub I/O line pairs.

An equalizing transistor 99 is connected between main I/O line pair GIO and $\overline{GIO}$. Equalizing transistors 86–89 are respectively connected between sub I/O line pairs $LIO_1$ and $\overline{LIO_1}$-$LIO_4$ and $\overline{LIO_4}$. An equalize signal generating circuit 200 is provided in the vicinity of equalizing transistor 99. Therefore, the distance between equalize signal generating circuit 200 and respective equalizing transistors becomes greater in the order of transistors 89, 88, 87 and 86.

Equalize signal generating circuit 200 is the same as that shown in FIG. 3. It should be noted that equalize signal $\phi_E$ shown in FIG. 3 is indicated as $\phi_3$ in FIG. 5. Equalize signal $\phi_3$ output from equalize signal generating circuit 200 is supplied to respective gate electrodes of equalizing transistors 90–97 and 99.

As described above, block selecting signals $BS_1$-$BS_4$ are supplied to respective n channel MOS transistor pairs 90 and 91–96 and 97.

In the semiconductor memory device of the above-described structure, I/O line pairs are formed hierarchically by a main I/O line pair and sub I/O line pairs. In order to accelerate equalization of such I/O line pairs having the hierarchical structure, equalizing transistor 99 is provided on main I/O lines, and equalizing transistors 86–89 are respectively provided on sub I/O lines.

In such a hierarchical structure of the I/O lines, a length of the main I/O line is as long as about 10 mm for 64 MDRAM. Therefore, in the semiconductor memory device shown in FIG. 5, arrival of equalize signal $\phi_3$ at equalizing transistor 86 is delayed from arrival of equalize signal $\phi_3$ at equalizing transistor 99 by about 1 ns. The reason for this is different lengths of the signal transfer path.

Figure 6F:
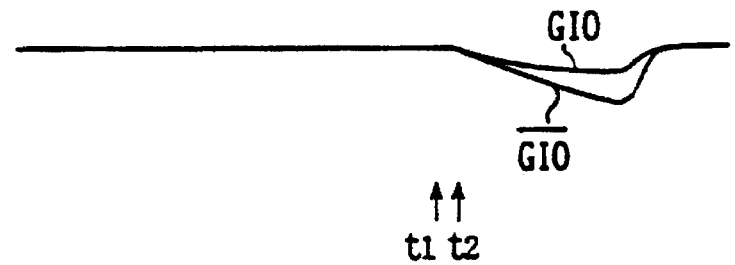

FIG. 6 is a timing chart showing operations of the semiconductor memory device shown in FIG. 5. In FIG. 6, the equalize signal arriving at equalizing transistor 86 is indicated by $\phi_3$ (far).

As can be seen from FIG. 6, output signal $\phi_1$ from the address change detecting circuit attains the L level after the change of the address, causing equalize signal $\phi_3$ to attain the L level. However, equalize signal $\phi_3$ (far) which controls equalizing transistor 86 attains the L level at time $t_2$ due to the propagation delay of signal.

In the case of data reading, sub I/O line pairs $LIO_1$ and $\overline{LIO_1}$ remain short-circuited until transistor 86 becomes non-conductive in response to signal $\phi_3$ (far) attaining the L level. Therefore, in such a structure, the potential difference corresponding to the read data might not be generated between main I/O line pair GIO and $\overline{GIO}$ before time $t_2$. The following fourth embodiment is made to solve such a problem.

Embodiment 4

Now, a fourth embodiment will be described in which an equalize signal supplied to equalizing transistors for main I/O line pair is different from that supplied to equalizing transistors for sub I/O line pairs in order to solve the above-described problem.

Figure 7:
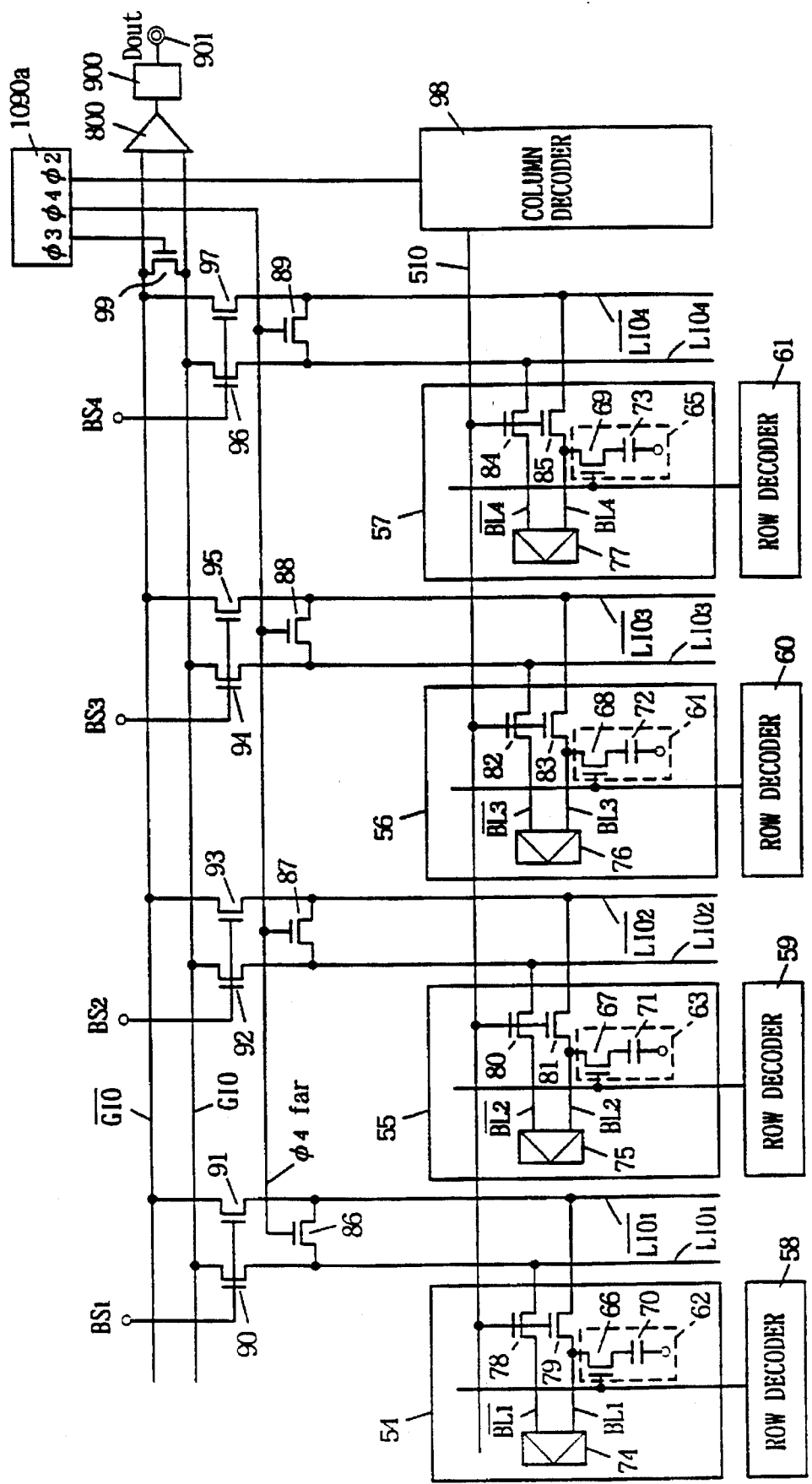
FIG. 7 is a circuit diagram showing a structure of a semiconductor memory device according to a fourth embodiment of the present invention.

FIG. 7 is a circuit diagram showing a structure of a semiconductor memory device according to the fourth embodiment. The semiconductor memory device shown in FIG. 7 is different from that shown in FIG. 5 in the structure of equalize signal generating circuit 1090a and the place to which equalize signal $\phi_4$ output from equalize signal generating circuit 1090a is supplied.

In the semiconductor memory device shown in FIG. 7, an equalize signal generating circuit 1090a generates independently from equalize signal $\phi_E$ an equalize signal $\phi_4$ for supplying to equalizing transistors 86–89 provided on respective sub I/O line pairs.

Figure 8:
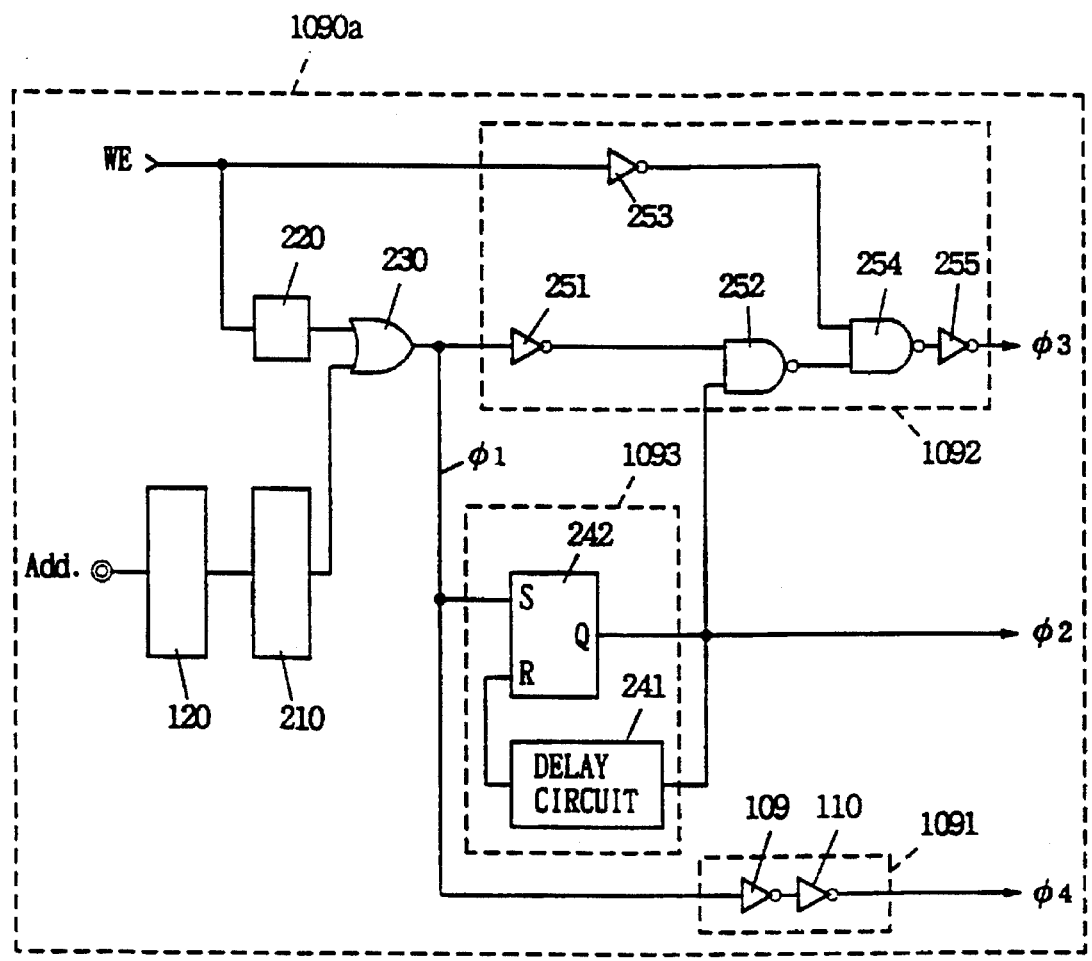
FIG. 8 is a circuit diagram showing a structure of an equalize signal generating circuit shown in FIG. 7.

FIG. 8 is a circuit diagram showing a structure of equalize signal generating circuit 1090a shown in FIG. 7. With reference to FIG. 8, equalize signal generating circuit 1090a includes a column address buffer 120, an address change detecting circuit 210, a write termination detecting circuit 220, an OR circuit 230, a first signal generating circuit 1091, a second signal generating circuit 1092, a third signal generating circuit 1093, and inverters 109, 110. First signal generating circuit 1091 includes series-connected inverters 109 and 110. Second signal generating circuit 1092 includes inverters 251, 253 and 255, and NAND circuits 252 and 254. Third signal generating circuit 1093 includes an R-S flipflop circuit 242 and a delay circuit 241.

It is noted that second signal generating circuit 1092 corresponds to, for example, second signal generating circuit 250 shown in FIG. 3, and third signal generating circuit 1093 corresponds to, for example, first signal generating circuit 240 shown in FIG. 3.

Equalize signal generating circuit 1090a is different from that shown in FIG. 3 in a portion of first signal generating circuit 1091 in which series-connected inverters 109 and 110 generate equalize signal $\phi_4$ based on signal $\phi_1$ output from OR circuit 230.

By such a structure, generated equalize signal $\phi_4$ changes faster than generated equalize signal $\phi_3$ by two stages of a gate circuit.

Figure 9:
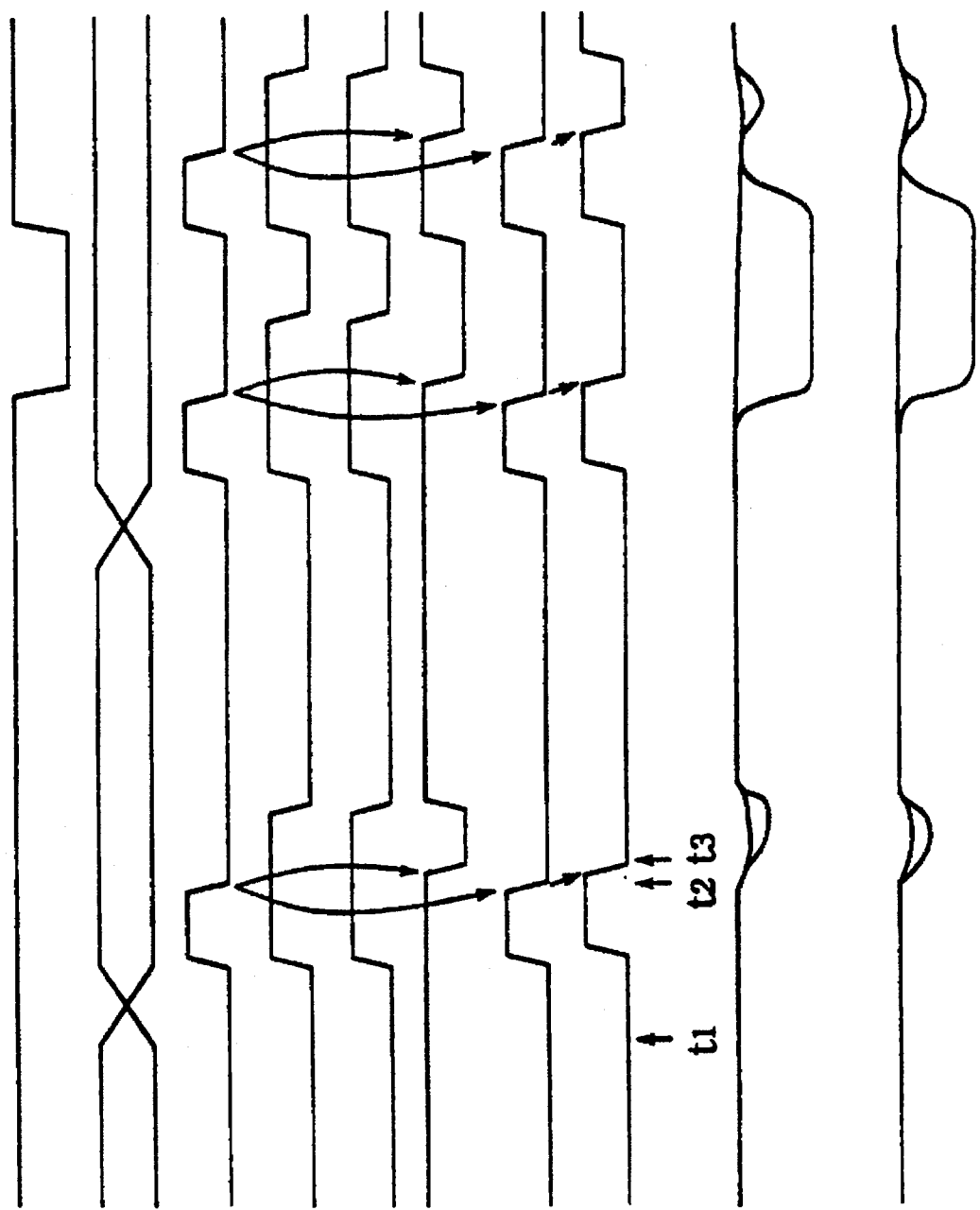
FIG. 9a–9j are timing charts showing operations of the semiconductor memory device shown in FIGS. 7 and 8.

Now, operations of the semiconductor memory device utilizing equalize signal generating circuit 1090a shown in FIG. 8 will be described. FIG. 9 is a timing chart for illustration of the operations. In FIG. 9, signal $\phi_4$ arriving at the equalizing transistor located at the farthest position from equalize signal generating circuit 1090a is indicated as $\phi_4$ (far). With reference to FIG. 9, after the address is changed at time $t_1$, signal $\phi_1$ output from address change detecting circuit 210 via OR circuit 230 attains the L level at time $t_2$, causing equalize signal $\phi_4$ to attain the L level.

After equalize signal $\phi_4$ attains the L level, equalize signal $\phi_3$ attains the L level at the time when the signal is delayed by two stages of gates of NAND circuit 254 and inverter 255. Therefore, in FIG. 7, if the amount of propagation delay of the signal from equalize signal generating circuit 1090a to equalizing transistor 86 is not more than two stages of the gate, equalizing transistor 86 for sub I/O line pair LIO$_1$ and $\overline{LIO_1}$ is rendered non-conductive prior to equalizing transistor 99 for main I/O line pair GIO and $\overline{GIO}$. Thus, reduction of the data reading speed due to the propagation delay of the equalize signal can be prevented.

Embodiment 5

Now, a fifth embodiment will be described which prevents a delay in data reading even in the case when the amount of propagation delay of the signal to reach the equalizing transistor located at the farthest position from the equalize signal generating circuit is not less than two stages of a gate.

Figure 10:
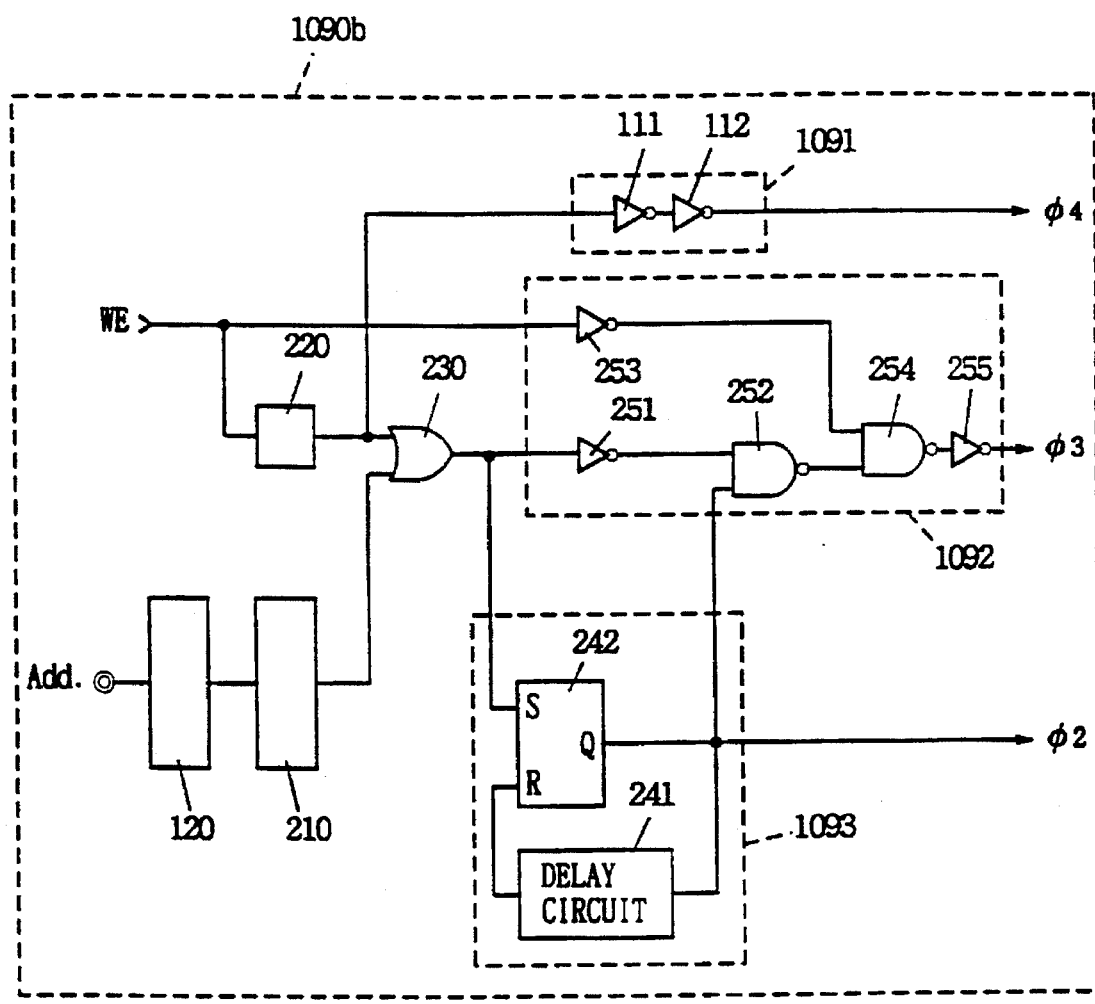
FIG. 10 is a circuit diagram showing an equalize signal generating circuit in a semiconductor memory device according to a fifth embodiment of the present invention.

FIG. 10 is a circuit diagram showing a structure of an equalize signal generating circuit in the semiconductor device according to the fifth embodiment. An equalize signal generating circuit 1090b shown in FIG. 10 is different from that shown in FIG. 8 in that an output signal from write termination detecting circuit 220 is generated as equalize signal $\phi_4$ via series-connected inverters 111 and 112.

Figure 11:
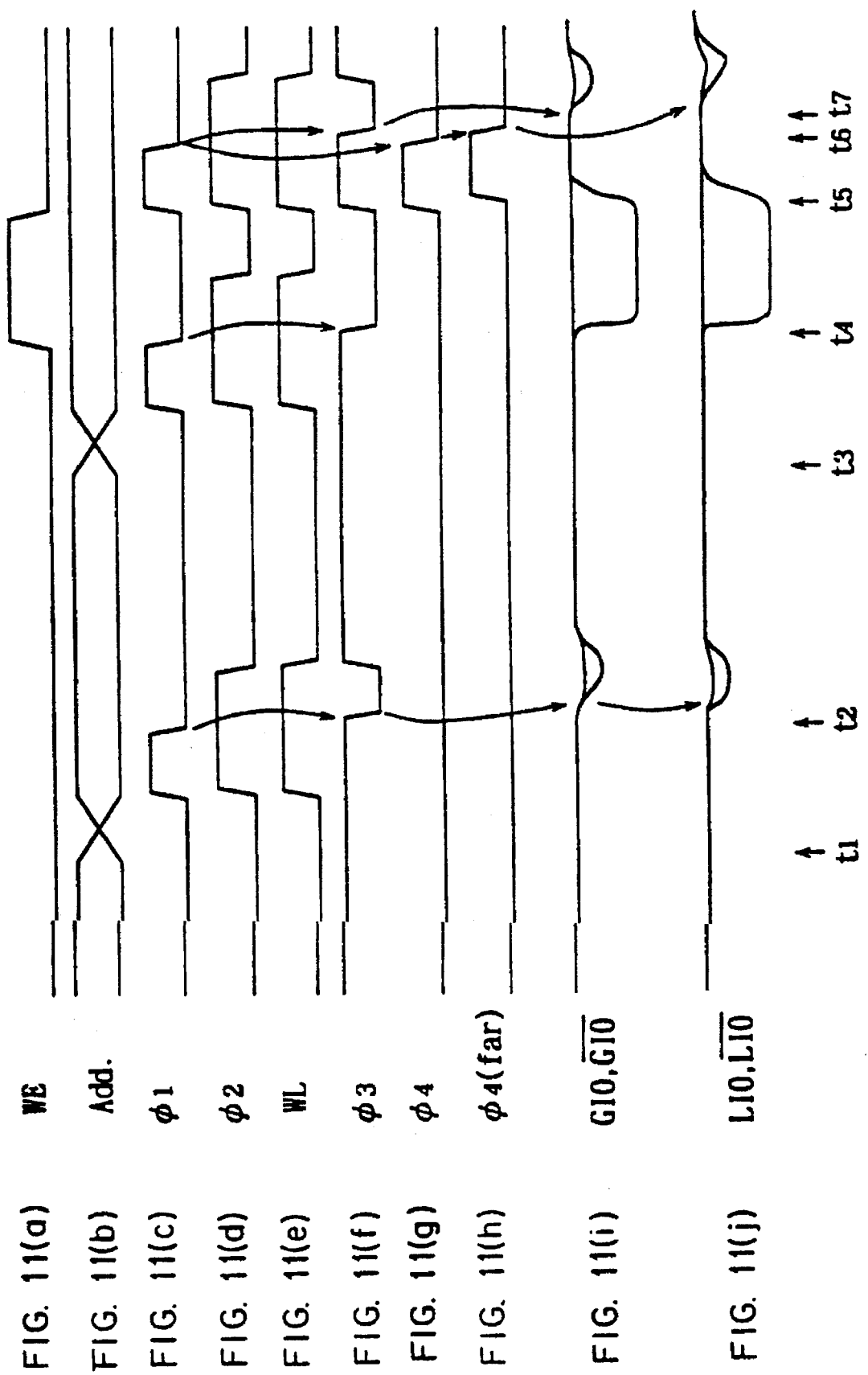
FIG. 11a–11j are timing charts showing operations of the semiconductor memory device including the equalize signal generating circuit shown in FIG. 10.
Figure 12:
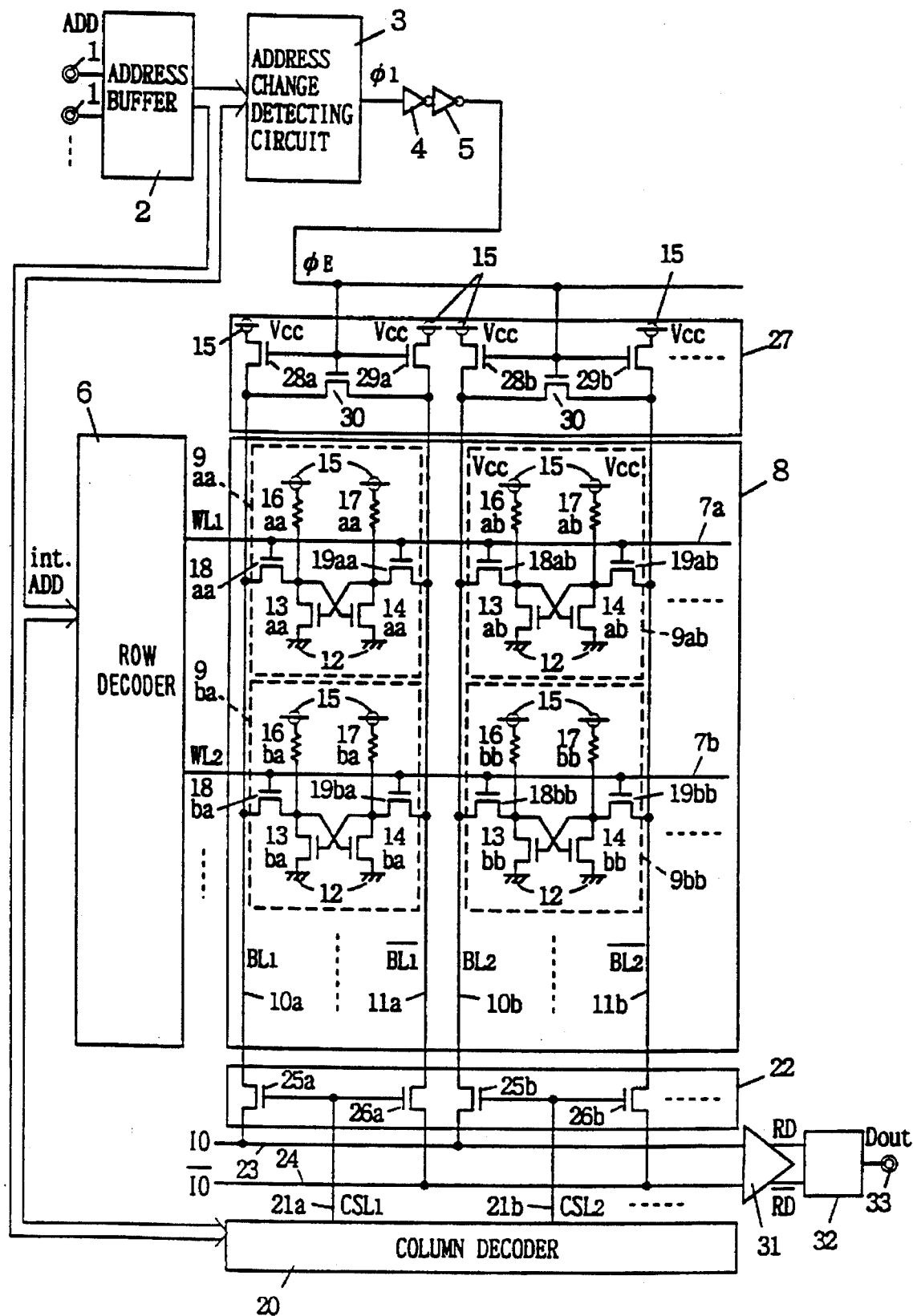
FIG. 12 is a circuit diagram showing a structure of a conventional semiconductor memory device.

Now, operations of the semiconductor memory device utilizing equalize signal generating circuit 1090b shown in FIG. 10 will be described. FIG. 11 is a timing chart illustrating the operations. In FIG. 11, signal $\phi_4$ arriving at the equalizing transistor located at the farthest position from equalize signal generating circuit 1090b is indicated as $\phi_4$ (far).

With reference to FIG. 11, equalize signal generating circuit 1090b is characterized in that equalize signal $\phi_4$ remains at the L level and equalize signal $\phi_3$ remains at the H level in a reading cycle starting at time $t_2$, while in a writing cycle starting at time $t_3$, both equalize signals $\phi_4$ and $\phi_3$ attain the H level after write signal WE falls to the L level.

As can be seen from FIG. 11, in the reading cycle, equalization is started upon generation of a certain potential difference which can be amplified by differential amplifying circuit 800. On the other hand, in the writing cycle, both a potential difference between main I/O lines GIO and $\overline{GIO}$ and a potential difference between sub I/O lines LIO and $\overline{LIO}$ are rendered to have a large amplitude in order to transfer the write data to bit lines.

Therefore, in the writing cycle in which the potential difference to be equalized is large, equalization can be carried out at a high speed by operating all equalizing transistors 99 and 86–89. On the other hand, in the reading cycle in which the potential difference to be equalize is small, equalization is carried out only by equalizing transistor 99. Thus, reduction in reading speed due to the propagation delay of equalize signal $\phi_4$ can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

first and second signal lines juxtaposed and extending respectively in predetermined directions for receiving potentials corresponding to data from a memory cell;

a plurality of signal lines consisting of a third signal line corresponding to said first signal line and a fourth signal line corresponding to said second signal line in which the third and fourth signal lines are connected to corresponding first and second signal lines through connecting means for carrying out connection and disconnection in response to a connection signal;

amplifying means for receiving potentials on said first and second signal lines, and outputting read data which attains a first level when the potential on said first signal line is higher than that on said second signal line by at least a first predetermined voltage and which attains a second level when the potential on said first signal line is lower than that on said second signal line by at least a second predetermined voltage;

equalize signal generating means for receiving an address signal, and outputting a first equalize signal having two levels which changes from a third level to a fourth level when a predetermined period is passed after a change of the address signal and, a second equalize signal which changes from a fifth level to a sixth level after the first equalize signal changes from said third level to said fourth level and which attains said sixth level when an absolute value of the potential difference between said first and second signal lines attains one of said first and second predetermined voltages;

a plurality of first signal line equalizing means provided corresponding to respective said plurality of signal line pairs, each means receiving said first equalize signal, for equalizing the potentials on corresponding said third and fourth signal lines when the first equalize signal is at said third level and stopping equalization when said first equalize signal is at said fourth level; and second signal line equalizing means connected to said first and second signal lines for receiving said second equalize signal for equalizing the potentials on said first and second signal lines when the second equalize signal is at said fifth level and stopping equalization when the second equalize signal is at said sixth level.

2. The semiconductor memory device according to claim 1, wherein said equalize signal generating means includes address change detecting means which receives said address signal and outputs an address change signal in response to a change of the address signal, first equalize signal generating means which outputs said first equalize signal in response to said address change signal, and second equalize signal generating means which outputs said second equalize signal in response to said address change signal.

3. The semiconductor memory device according to claim 2, wherein said first equalize signal generating means includes delay means which delays said address change detecting signal and outputs the delayed signal as said first equalize signal.

4. The semiconductor memory device according to claim 1, further comprising a plurality of memory cell blocks provided corresponding to respective said plurality of signal line pairs, each memory cell block including said memory cell.

5. The semiconductor memory device according to claim 1, wherein said equalize signal generating means further includes third signal generating means having delay means for receiving said address change signal and a delay signal obtained by an internally generated first signal having two levels of seventh and eighth levels passing through said delay means, and generating said first signal which changes from said seventh level to said eighth level in response to the change of said address change signal and which changes from said eighth level to said seventh level in response to the change of said delay signal in accordance with said first signal changing from said seventh level to said eighth level, and the device further comprising a column decoder provided for selecting a column selection line, and receiving said first signal so as to be activated when the first signal is at said eighth level.

* * * * *